US011152359B2

(12) United States Patent
Kim et al.

(10) Patent No.: US 11,152,359 B2
(45) Date of Patent: Oct. 19, 2021

(54) INTEGRATED CIRCUIT DEVICE AND A METHOD OF MANUFACTURING THE SAME

(71) Applicant: SAMSUNG ELECTRONICS CO., LTD., Suwon-si (KR)

(72) Inventors: Jeonglim Kim, Seoul (KR); Sunghwan Bae, Seoul (KR); Seulki Hong, Seoul (KR); Myungsoo Noh, Seoul (KR); Moongi Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/929,269

(22) Filed: Jul. 15, 2020

(65) Prior Publication Data

US 2021/0134796 A1     May 6, 2021

(30) Foreign Application Priority Data

Nov. 6, 2019  (KR) ........................ 10-2019-0140790

(51) Int. Cl.
  *H01L 27/088*  (2006.01)
  *H01L 29/78*  (2006.01)
  *H01L 29/417*  (2006.01)

(52) U.S. Cl.
  CPC .... *H01L 27/0886* (2013.01); *H01L 29/41791* (2013.01); *H01L 29/7851* (2013.01); *H01L 2029/7858* (2013.01)

(58) Field of Classification Search
  CPC ............. H01L 27/0886; H01L 29/7851; H01L 29/41791; H01L 2029/7858; H01L 29/785
  See application file for complete search history.

(56) References Cited

U.S. PATENT DOCUMENTS

| | | | |
|---|---|---|---|
| 7,683,437 B2 * | 3/2010 | Mikasa | H01L 29/66795 257/401 |
| 7,705,464 B2 | 4/2010 | Liaw et al. | |
| 8,341,985 B2 | 4/2013 | Hou et al. | |
| 8,431,985 B2 | 4/2013 | Hou et al. | |
| 9,214,358 B1 * | 12/2015 | Lin | H01L 21/28035 |

(Continued)

FOREIGN PATENT DOCUMENTS

| | | |
|---|---|---|
| JP | 2010-010590 | 1/2010 |
| KR | 10-1187309 | 9/2012 |

*Primary Examiner* — Earl N Taylor
(74) *Attorney, Agent, or Firm* — F. Chau & Associates, LLC

(57) ABSTRACT

An integrated circuit device includes: a substrate including a fin type active region extending in a first direction; a gate structure intersecting the fin type active region and extending in a second direction perpendicular to the first direction; a source/drain region on sides of the gate structure; a gate isolation insulating layer contacting an end of the gate structure; a first contact connected to the source/drain region; and a second contact connected to the source/drain region, the second contact being longer in the second direction than the first contact, the second contact includes a first portion extending in the second direction from an area adjacent to one side of the gate structure beyond the end of the gate structure and facing a sidewall of the gate structure, and a second portion facing a sidewall of the gate isolation insulating layer, and the first portion is wider than the second portion.

20 Claims, 21 Drawing Sheets

(56) References Cited

U.S. PATENT DOCUMENTS

| | | | |
|---|---|---|---|
| 9,293,459 B1* | 3/2016 | Cheng | H01L 21/76224 |
| 9,601,492 B1* | 3/2017 | Deng | H01L 27/0924 |
| 9,871,103 B2 | 1/2018 | Kim et al. | |
| 9,917,085 B2* | 3/2018 | Lin | H01L 21/823431 |
| 9,947,592 B2* | 4/2018 | Deng | H01L 21/823878 |
| 10,170,480 B2 | 1/2019 | Liaw | |
| 10,269,802 B2* | 4/2019 | Lin | H01L 27/0886 |
| 10,297,596 B2 | 5/2019 | Sharma et al. | |
| 10,374,085 B2 | 8/2019 | Kim et al. | |
| 10,510,894 B2* | 12/2019 | Chang | H01L 21/76229 |
| 10,685,966 B2* | 6/2020 | Liaw | H01L 27/0207 |
| 10,741,450 B2* | 8/2020 | Chang | H01L 29/0649 |
| 10,840,352 B2* | 11/2020 | Rachmady | B82Y 40/00 |
| 10,868,001 B2* | 12/2020 | Ching | H01L 29/0649 |
| 2007/0045735 A1* | 3/2007 | Orlowski | H01L 29/41733 257/347 |
| 2015/0054078 A1* | 2/2015 | Xie | H01L 27/1211 257/347 |
| 2015/0145041 A1* | 5/2015 | Divakaruni | H01L 27/1211 257/347 |
| 2016/0133632 A1* | 5/2016 | Park | H01L 21/845 257/369 |
| 2019/0013208 A1* | 1/2019 | Lee | H01L 21/823431 |
| 2019/0148374 A1* | 5/2019 | Bae | H01L 29/7851 257/401 |
| 2019/0221563 A1 | 7/2019 | Choi et al. | |
| 2019/0386099 A1* | 12/2019 | Kim | H01L 29/0649 |
| 2020/0185524 A1* | 6/2020 | Paak | H01L 23/485 |
| 2020/0303511 A1* | 9/2020 | Tsai | H01L 21/0228 |
| 2021/0134796 A1* | 5/2021 | Kim | H01L 27/0886 |

* cited by examiner

INTEGRATED CIRCUIT DEVICE AND A METHOD OF MANUFACTURING THE SAME

CROSS-REFERENCE TO RELATED APPLICATION

This application claims priority under 35 U.S.C. § 119 to Korean Patent Application No. 10-2019-0140790, filed on Nov. 6, 2019, in the Korean Intellectual Property Office, the disclosure of which is incorporated by reference herein in its entirety.

TECHNICAL FIELD

The inventive concept relates to an integrated circuit device and a method of manufacturing the same, and more particularly, to an integrated circuit device including a contact structure that provides an electrical connection to a fin type active region.

DISCUSSION OF RELATED ART

As the number of portable electronic products increases, so does the demand for integrated circuit devices with high integration. Due to the down scaling of the integrated circuit devices, a short channel effect may occur in a transistor, thereby deteriorating the reliability of the integrated circuit devices. To reduce the short channel effect, an integrated circuit device including a fin type active region may be employed. In addition, as design rules decrease, a size of a contact structure that provides an electrical connection to the fin type active region is also decreasing.

SUMMARY

According to an exemplary embodiment of the inventive concept, an integrated circuit device includes: a substrate including a fin type active region extending in a first direction; a gate structure intersecting the fin type active region on the substrate and extending in a second direction perpendicular to the first direction; a source/drain region arranged on both sides of the gate structure; a gate isolation insulating layer in contact with an end of the gate structure; a first contact connected to the source/drain region; and a second contact connected to the source/drain region, the second contact having a longer length in the second direction than the first contact, wherein the second contact includes a first portion extending in the second direction from an area adjacent to one side of the gate structure beyond the end of the gate structure and facing a sidewall of the gate structure, and a second portion facing a sidewall of the gate isolation insulating layer, and wherein a first width in the first direction of the first portion is greater than a second width in the first direction of the second portion.

According to an exemplary embodiment of the inventive concept, an integrated circuit device includes: a substrate including a fin type active region extending in a first direction; a gate structure intersecting the fin type active region on the substrate and extending in a second direction perpendicular to the first direction; a source/drain region arranged on both sides of the gate structure; a gate isolation insulating layer in contact with an end of the gate structure, a first contact connected to the source/drain region and not crossing the gate isolation insulating layer; and a second contact connected to the source/drain region and extending in the second direction while crossing the gate isolation insulating layer, wherein a width in the first direction of the first contact is greater than a width in the first direction of the second contact.

According to an exemplary embodiment of the inventive concept, an integrated circuit device includes: a substrate including a fin type active region extending in a first direction; a plurality of gate structures intersecting the fin type active region on the substrate and extending in a second direction perpendicular to the first direction and parallel to a top surface of the substrate; source/drain regions arranged between the plurality of the gate structures; a gate isolation insulating layer extending in the first direction on the substrate and in contact with at least one end of the plurality of gate structures; a first active contact connected to a first one of the source/drain regions; and a second active contact connected to a second one of the source/drain regions and extending in the second direction from between a first pair of neighboring gate structures to between a second pair of neighboring gate structures while crossing the gate isolation insulating layer, wherein the second active contact includes: a first portion arranged between the first pair or second pair of neighboring gate structures; and a second portion in contact with the gate isolation insulating layer, and wherein a width in the first direction of the first portion is greater than a width in the first direction of the second portion.

According to an exemplary embodiment of the inventive concept, an integrated circuit device includes: a substrate including a fin type active region extending in a first direction; a gate structure intersecting the fin type active region and extending in a second direction perpendicular to the first direction; a source/drain region arranged on sides of the gate structure; a contact connected to the source/drain region, wherein the contact includes a first portion and a second portion each extending in the second direction, the first portion disposed between a pair of gate lines, the second portion connected to the first portion and passing through a gate cut region, and wherein a width in the first direction of the first portion is greater than a width in the first direction of the second portion.

BRIEF DESCRIPTION OF THE DRAWINGS

The above and other features of the inventive concept will be more clearly understood by describing in detail exemplary embodiments thereof in conjunction with the accompanying drawings in which.

DETAILED DESCRIPTION OF THE EMBODIMENTS

Hereinafter, exemplary embodiments of the inventive concept will be described in detail with reference to the accompanying drawings.

Figure 1:
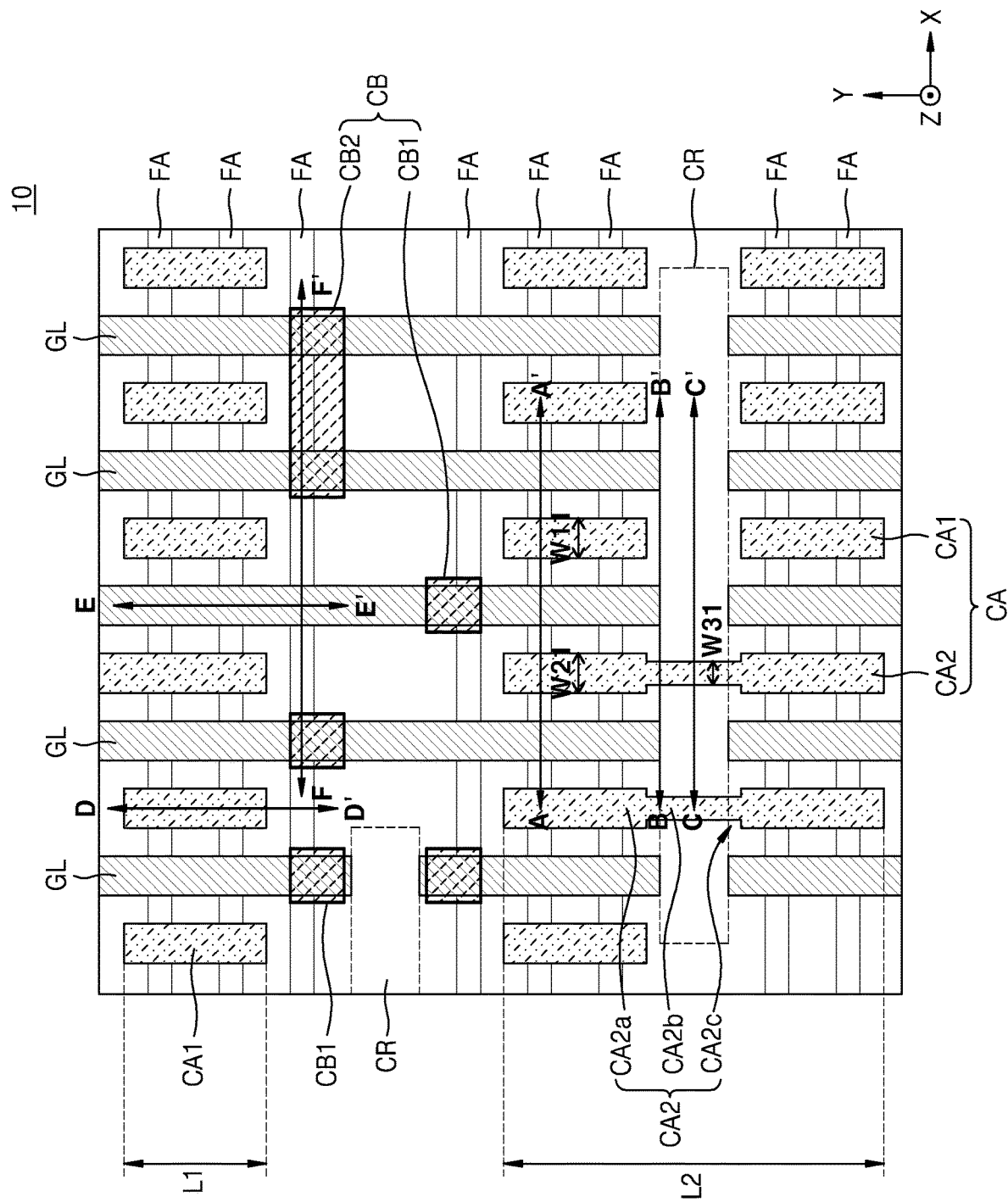
FIG. 1 is a layout illustrating an integrated circuit device according to an exemplary embodiment of the inventive concept.
Figure 2A:
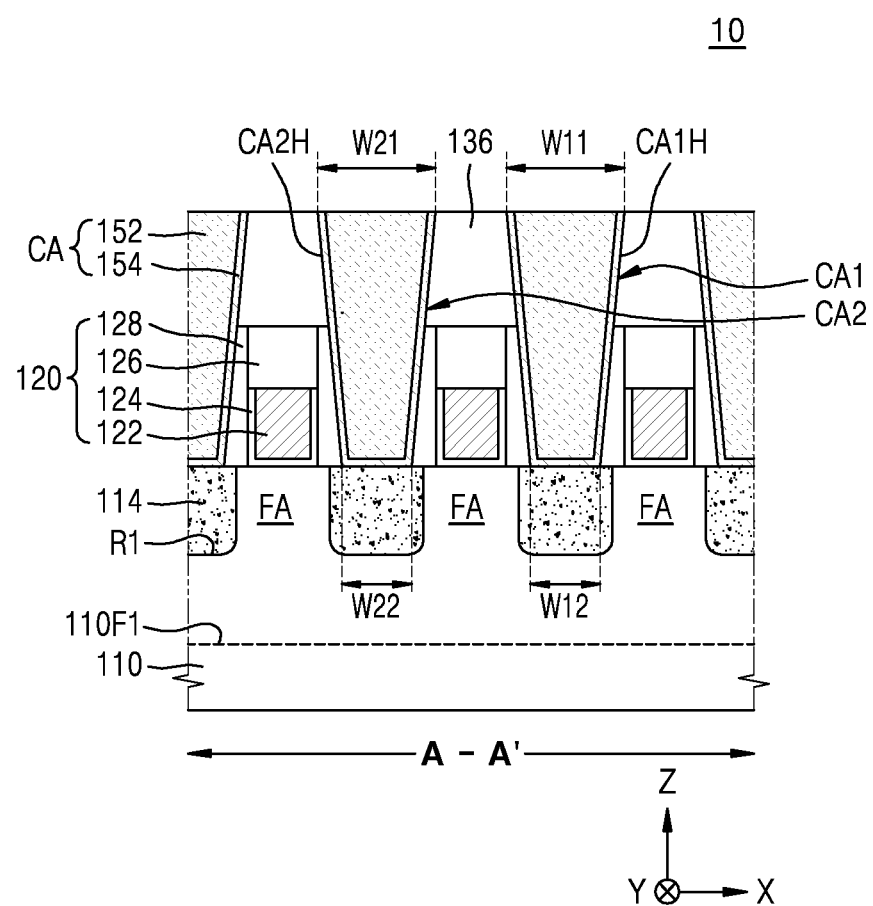
FIGS. 2A, 2B, 2C, 2D, 2E and 2F are cross-sectional views taken along lines A-A', B-B', C-C', D-D', E-E', and F-F' of FIG. 1, respectively.
Figure 2B:
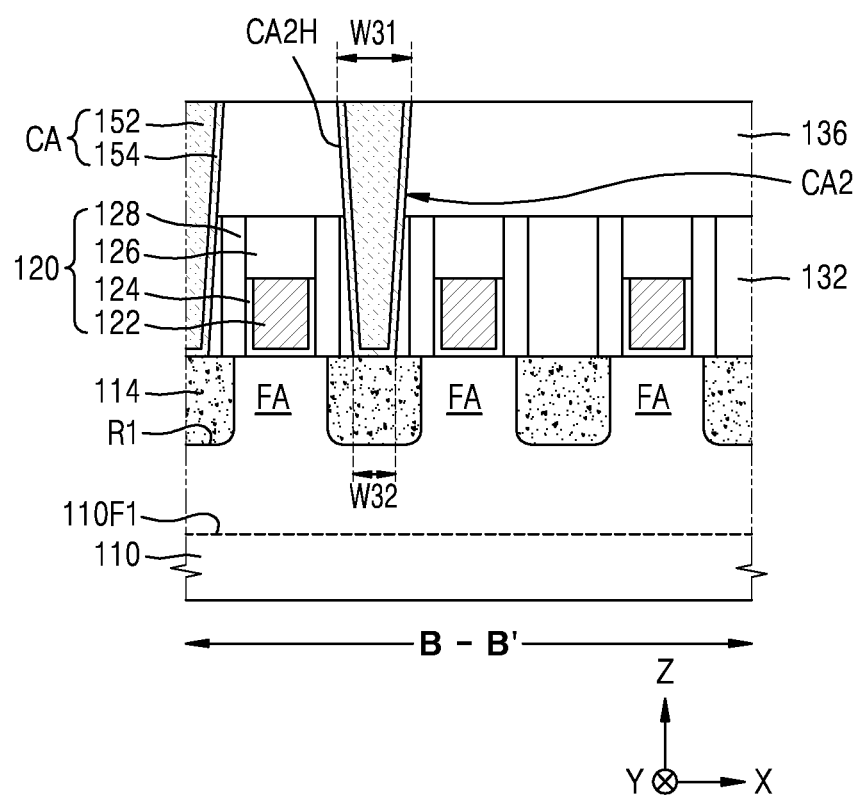
Figure 2C:
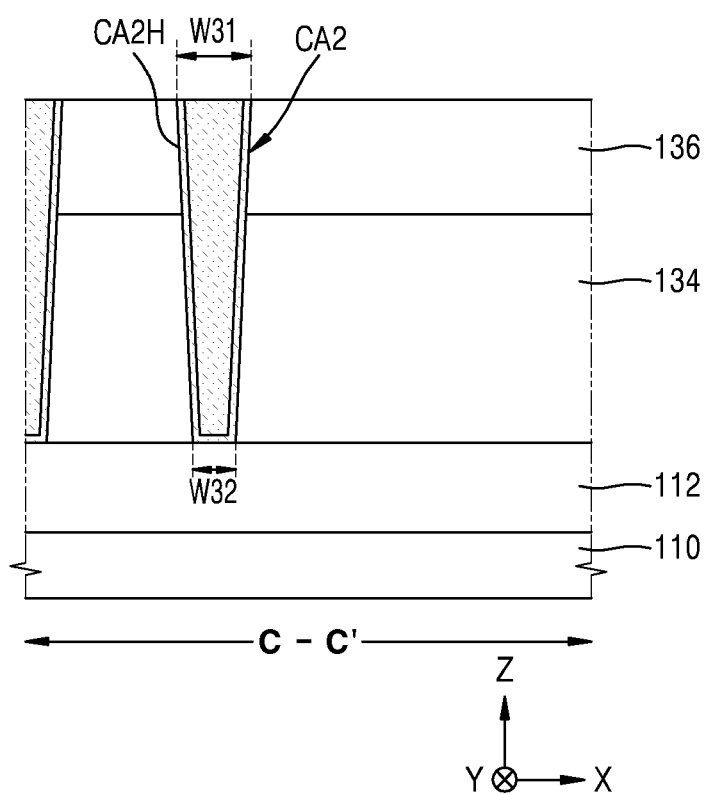
Figure 2D:
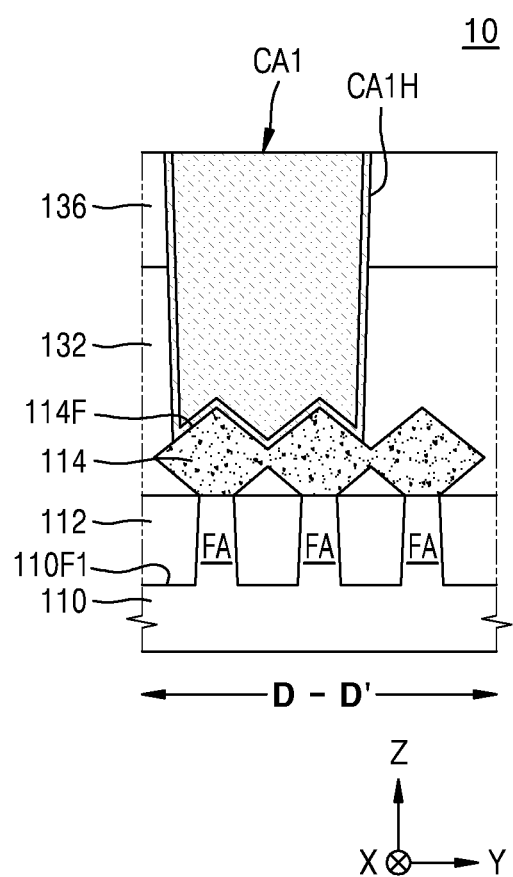
Figure 2E:
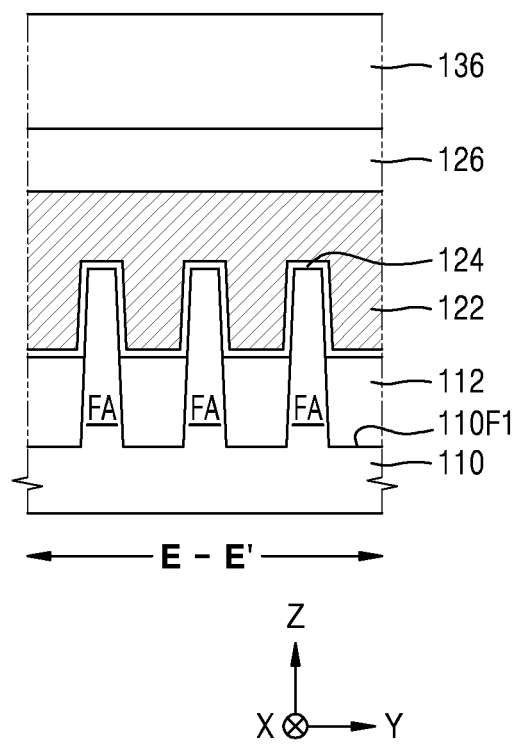
Figure 2F:
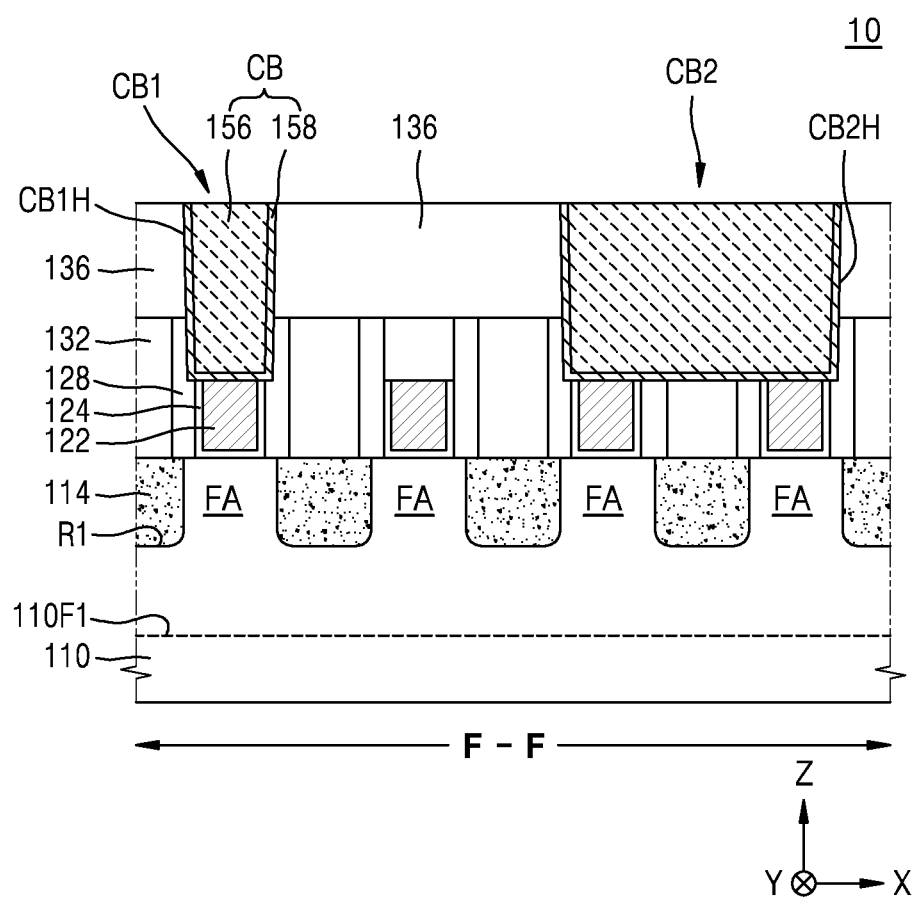

FIG. 1 is a layout illustrating an integrated circuit device according to an exemplary embodiment of the inventive concept, and FIGS. 2A to 2F are cross-sectional views taken along lines A-A', B-B', C-C', D-D', E-E', and F-F' of FIG. 1.

In FIGS. 1 and 2A to 2F, the integrated circuit device 10 may include a substrate 110 having a fin type active region FA, a gate structure 120 extending and intersecting with the fin type active region FA, a source/drain region 114 arranged on both sides of the gate structure 120, a gate isolation insulating layer 134 in contact with an end of the gate structure 120, and an active contact CA electrically connected to the source/drain region 114.

The substrate 110 may be a wafer including silicon (Si). In exemplary embodiments of the inventive concept, the substrate 110 may be a wafer including a semiconductor element such as germanium (Ge), or a compound semiconductor such as silicon carbide (SiC), gallium arsenide (GaAs), indium arsenide (InAs), or indium phosphide (InP). In addition, the substrate 110 may have a silicon on insulator (SOI) structure. The substrate 110 may include a conductive region, for example, a well doped with impurities or a structure doped with impurities.

The fin type active region FA may protrude from atop surface 110F1 of the substrate 110. The fin type active region FA may extend in a first direction (an X direction) parallel to the top surface 110F1 of the substrate 110. A device isolation layer 112 may be arranged on the substrate 110 to cover lower portions of both sidewalls of the fin type active region FA.

The fin type active region FA may be an active region constituting a p-channel metal oxide semiconductor (p-MOS) transistor, or may be an active region constituting an n-channel metal oxide semiconductor (n-MOS) transistor. The gate structures 120 may be arranged on the fin type active region FA and the device isolation layer 112. The gate structures 120 may be spaced apart from each other in the first direction (the X direction), may be parallel to the top surface 110F1 of the substrate 110 and may extend in a second direction (a Y direction) perpendicular to the first direction (the X direction). The gate structure 120 may include a gate electrode 122, a gate insulating layer 124, a gate capping layer 126, and a gate spacer 128.

The gate electrode 122 may correspond to each of a plurality of gate lines GL extending in the second direction (the Y direction). The gate electrode 122 may include doped polysilicon, metal, or a combination thereof. For example, the gate electrode 122 may include Al, Cu, Ti, Ta, W, Mo, TaN, NiSi, CoSi, TiN, WN, TiAl, TiAlN, TaCN, TaC, TaSiN, TiAlC, or combinations thereof, but is not limited thereto.

In exemplary embodiments of the inventive concept, the gate electrode 122 may include a work function metal-containing layer and a gap fill metal film. The work function metal-containing layer may include Ti, W, Ru, Nb, Mo, Hf, Ni, Co, Pt, Yb, Tb, Dy, Er, or Pd. The gap fill metal film may include tungsten (W) or aluminum (Al). In other exemplary embodiments of the inventive concept, the gate electrode 122 may be a stacked structure, including a stacked structure of TiAlC/TiN/W, a stacked structure of TiN/TaN/TiAlC/TiN/W, or a stacked structure of TiN/TaN/TiN/TiAlC/TiN/W, but is not limited thereto.

The gate insulating layer 124 may be arranged on a bottom surface and a sidewall of the gate electrode 122 and extend in the second direction (the Y direction). The gate insulating layer 124 may be interposed between the gate electrode 122 and the fin type active region FA and between the gate electrode 122 and atop surface of the device isolation layer 112. The gate insulating layer 124 may include silicon oxide, silicon oxynitride, a high dielectric film having a higher dielectric constant than silicon oxide, or combinations thereof. The high dielectric film may include metal oxide or metal oxynitride. For example, the high dielectric film that may be used as the gate insulating layer 124 may include $HfO_2$, HfSiO, HfSiON, HfaO, HfTiO, HfZO, zirconium oxide, aluminum oxide, $HfO_2$—$Al_2O_3$ alloy, or combinations thereof, but is not limited thereto.

The gate capping layer 126 may be arranged on the gate electrode 122. The gate capping layer 126 may cover a top surface of the gate electrode 122 and may extend in the second direction (the Y direction). In exemplary embodiments of the inventive concept, the gate capping layer 126 may include silicon nitride.

The gate spacer 128 may be arranged on both sidewalls of the gate electrode 122 and both sidewalls of the gate capping layer 126. The gate spacer 128 may extend in an extension direction of the gate electrode 122 on both sidewalls of the gate electrode 122. The gate insulating layer 124 may be interposed between the gate electrode 122 and the gate spacer 128. In exemplary embodiments of the inventive concept, the gate spacer 128 may include silicon oxide, silicon nitride, silicon oxynitride, silicon carbonitride, or combinations thereof.

The gate spacer 128 may include a plurality of layers including different materials. In the figures, the gate spacer 128 is illustrated as a single layer. However, the gate spacer 128 may include a first spacer layer, a second spacer layer, and a third spacer layer sequentially stacked on the sidewalls of the gate electrode 122. In exemplary embodiments of the inventive concept, the first spacer layer and the third spacer layer may include silicon nitride, silicon oxide, or silicon oxynitride. The second spacer layer may include an insulating material having a lower dielectric constant than the first spacer layer, or the second spacer layer may include an air gap.

The source/drain regions 114 may be arranged in the fin type active regions FA on both sides of the gate structure 120. The source/drain region 114 may include, for example, doped SiGe, doped Ge, doped SiC, or doped InGaAs, but the source/drain region 114 is not limited thereto. In exemplary embodiments of the inventive concept, when the fin type active region FA is an active region for an n-MOS transistor, the source/drain region 114 may include doped SiC, and in other exemplary embodiments of the inventive concept, when the fin type active region FA is the active region for a p-MOS transistor, the source/drain region 114 may include doped SiGe.

The source/drain region 114 may be formed by removing portions of the fin type active region FA under both sides of the gate structure 120 to form a recess region R1 and by growing a semiconductor layer filling the inside of the recess region R1 by an epitaxy process. In exemplary embodiments of the inventive concept, the source/drain region 114 may be formed in a polygonal shape having a plurality of inclined surfaces 114F, but is not limited thereto.

The source/drain region 114 may include a plurality of semiconductor layers having different compositions. For example, the source/drain region 114 may include a lower semiconductor layer, an upper semiconductor layer, and a capping semiconductor layer that sequentially fill the recess region R1. The lower semiconductor layer, the upper semiconductor layer, and the capping semiconductor layer may each include SiGe, but may vary in content of Si and Ge.

An inter-gate insulating layer 132 may be arranged to cover the source/drain regions 114 between the gate structures 120 adjacent to each other. The inter-gate insulating layer 132 may include silicon nitride, silicon oxide, or silicon oxynitride.

The plurality of gate lines GL may be arranged to be spaced apart at regular intervals in the first direction (the X direction) and to be extended in the second direction (the Y direction). In addition, the plurality of gate lines GL may be arranged to be spaced apart at predetermined intervals in the second direction (the Y direction) with a gate cut region CR therebetween. For example, in FIG. 1, the lower gate cut region CR is illustrated to meet five gate lines GL arranged in order and extend in the first direction (the X direction), but is not limited thereto. Depending on the requirement of the integrated circuit device 10, an area of the gate cut region CR may vary.

The gate isolation insulating layer 134 may be arranged in the gate cut region CR. The gate isolation insulating layer 134 may contact a cut end of the gate structure 120 and the gate isolation insulating layer 134 may have a top surface positioned at the same level as a top surface of the gate structure 120. The gate isolation insulating layer 134 may include, for example, silicon oxide, silicon nitride, or silicon oxynitride.

An interlayer insulating layer 136 may be arranged on the gate structure 120, the inter-gate insulating layer 132, and the gate isolation insulating layer 134. The interlayer insulating layer 136 may include silicon oxide, silicon nitride, silicon oxynitride, tetra ethyl ortho silicate (TEOS), or a low dielectric film having a low dielectric constant of about 2.2 to about 2.4.

The active contact CA may be arranged on the source/drain region 114 and a gate contact CB may be arranged on the gate structure 120.

The active contact CA may include an active contact plug 152 and a conductive barrier layer 154. In exemplary embodiments of the inventive concept, the active contact plug 152 may include Co, W, Ni, Ru, Cu, Al, silicides thereof, or alloys thereof. The conductive barrier layer 154 may surround sidewalls of the active contact plug 152, and the conductive barrier layer 154 may be between the active contact plug 152 and the gate spacer 128, between the active contact plug 152 and the interlayer insulating layer 136, and between the active contact plug 152 and the source/drain region 114. The conductive barrier layer 154 may include Ti, Ta, TiN, TaN, or combinations thereof. In other words, the conductive barrier layer 154 may be formed on inner walls of a first contact hole CA1H and a second contact hole CA2H, respectively. The active contact plug 152 may be formed on the conductive barrier layer 154 to form a first contact CA1 filling the first contact hole CA1H and a second contact CA2 filling the second contact hole CA2H.

The active contact CA may include the first contact CA1 and the second contact CA2. The first contact CA1 may be disposed on the source/drain region 114 between two neighboring gate structures 120, and the second contact CA2 may extend in the second direction (the Y direction) from between two neighboring gate structures 120 to one side of the gate isolation insulating layer 134. Optionally, a silicide layer may be formed between the active contact CA and the source/drain region 114. The silicide layer may include a metal silicide material such as cobalt silicide, nickel silicide, tungsten silicide, or the like.

Sidewalls of the first contact CA1 may contact the gate spacer 128 and the interlayer insulating layer 136 and may extend in a third direction (a Z direction) perpendicular to the top surface 110F1 of the substrate 110. The first contact CA1 may have a tapered profile in which an upper width W1 is greater than a lower width W12.

The second contact CA2 may be arranged on the source/drain region 114 between two neighboring gate structures 120 and may extend in the second direction (the Y direction) to contact the gate isolation insulating layer 134. In a plan view, the second contact CA2 may be between a first pair of gate lines GL spaced apart from each other in the first direction (the X direction) and may extend from between the first pair of gate lines GL to between a second pair of gate lines GL spaced apart from the first pair of gate lines GL in the second direction (the Y direction). In this case, a portion of the second contact CA2 may overlap the gate cut region CR.

The second contact CA2 may include a first portion CA2a facing or contacting the sidewall of the gate structure 120 and a second portion CA2b facing or contacting the gate isolation insulating layer 134. A first width W21 in the first direction (the X direction) of the first portion CA2a of the second contact CA2 may be greater than a second width W31 in the first direction (the X direction) of the second portion CA2b of the second contact CA2. Herein, among the first portion CA2a, a width of the first portion CA2a positioned in the same plane in the first direction (the X direction) as an end of the gate structure 120 may be substantially the same as the second width W31 of the second portion CA2b, unlike the first width W21. In other words, with reference to FIG. 1, a part of the first portion CA2a adjacent to an end of one of the gate lines GL in the first direction (the X direction) may have the second width W31.

A third portion CA2c connecting the first portion CA2a to the second portion CA2b of the second contact CA2 may be further included. The third portion CA2c of the second contact CA2 may be a portion protruding in a step shape. However, the third portion CA2c may actually include a different shape in the integrated circuit device 10.

Sidewalls of the second contact CA2 may contact the gate spacer 128 and the interlayer insulating layer 136 and may extend in the third direction (the Z direction) perpendicular to the top surface 110F1 of the substrate 110. The first portion CA2a of the second contact CA2 may have a tapered profile in which an upper width W21 is greater than a lower width W22, and likewise, the second portion CA2b of the second contact CA2 may have the tapered profile in which an upper width W31 is greater than a lower width W32.

Herein, the first contact CA1 and the second contact CA2 are compared as follows. A first length L1 in the second direction (the Y direction) of the first contact CA1 may be less than a second length L2 in the second direction (the Y direction) of the second contact CA2. Therefore, the first contact CA1 may be referred to as a short contact, and the second contact CA2 may be referred to as a long contact. In addition, the first contact CA1 may not overlap the gate isolation insulating layer 134, and the second contact CA2 may cross the gate isolation insulating layer 134. In addition, the upper width W11 in the first direction (the X direction)

of the first contact CA1 may be substantially the same as the upper width W21 of the first portion CA2a of the second contact CA2.

The gate contact CB may include a gate contact plug 156 and a conductive barrier layer 158. In exemplary embodiments of the inventive concept, the gate contact plug 156 may include Co, W, Ni, Ru, Cu, Al, silicides thereof, or alloys thereof. The conductive barrier layer 158 may surround sidewalls of the gate contact plug 156, and the conductive barrier layer 154 may be between the gate contact plug 156 and the gate spacer 128, between the gate contact plug 156 and the gate electrode 122, and between the gate contact plug 156 and the interlayer insulating layer 136. The conductive barrier layer 158 may include Ti, Ta, TiN, TaN, or combinations thereof. In other words, the conductive barrier layer 158 may be formed on inner walls of a third contact hole CB1H and a fourth contact hole CB2H, respectively. A third contact CB1 and a fourth contact CB2 respectively filling the third contact hole CB1H and the fourth contact hole CB2H may be formed by forming the gate contact plug 156 on the conductive barrier layer 158.

The gate contact CB may include the third contact CB1 and the fourth contact CB2. The third contact CB1 may be arranged on the gate structure 120 through the interlayer insulating layer 136. The fourth contact CB2 may be arranged on the gate structures 120 adjacent to each other, and the interlayer insulating layer 136 may surround a portion of sidewalls of the fourth contact CB2. In a plan view, the third contact CB1 may overlap one gate line GL, and the fourth contact CB2 may overlap two gate lines GL spaced apart from each other in the first direction (the X direction) and the inter-gate insulating layer 132 between the two gate lines GL.

An upper via and an upper interconnection may be further formed on the interlayer insulating layer 136. For example, the upper via may be between the active contact CA and the upper interconnection, or between the gate contact CB and the upper interconnection. The upper interconnection may include a stacked structure of a plurality of interconnection layers positioned at different levels, and an upper interlayer insulating layer surrounding the upper via and the upper interconnection may be further formed.

In addition, in the integrated circuit device 10 according to an exemplary embodiment of the inventive concept, a fin type transistor (FinFET) including a fin type active region FA is illustrated as shown in the figures, but is not limited thereto. For example, the integrated circuit device 10 according to an exemplary embodiment of the inventive concept may include a tunneling field effect transistor (tunneling FET), a transistor including nanowires, a transistor including nanosheets (e.g., MBCFET® (Multi Bridge Channel FET), or various three-dimensional (3D) transistors.

In general, as the down scaling of integrated circuit devices occurs, a transistor may have a short channel effect, which causes the reliability of the integrated circuit devices to be degraded. In order to reduce such a short channel effect, the integrated circuit device may include the fin type active region.

As design rules have been reduced below the limits of conventional photolithography processes, a new process using extreme ultraviolet (EUV) has been introduced. Through an extreme ultraviolet process, a pitch size of the gate line arranged on the fin type active region and a size of the contact structure providing an electrical connection to the fin type active region may be ultra miniaturized. However, such ultra miniaturization may cause a short circuit between the contact structure and the neighboring gate line (e.g., the gate electrode). In particular, the short circuit may occur mainly between the contact structure and a cut end of the gate line located in the gate cut region.

To prevent this, the integrated circuit device 10 according to an exemplary embodiment of the inventive concept may have a layout in which a separation distance between the gate electrode 122 at an end of the gate structure 120 and the first portion CA2a of the second contact CA2 is longer than a separation distance between the gate electrode 122 at a central portion of the gate structure 120 and the first portion CA2a of the second contact CA2. For example, in reference to FIG. 1, in the first direction (the X direction), the space between the central portion of the first portion CA2a and the gate line GL to the left is shorter than the space between the narrow part of the first portion CA2a and the gate line GL to the left.

In other words, the integrated circuit device 10 according to an exemplary embodiment of the inventive concept may be designed such that a separation distance between the gate electrode 122 and the second contact CA2 is relatively longer at the cut end of the gate structure 120, and therefore, a process margin may be sufficiently secured. Accordingly, the possibility of a short circuit may be significantly reduced. For example, a short circuit that may occur due to a phenomenon such as the climbing of a conductive material constituting the gate electrode 122 in the gate cut region CR, may be reduced.

As a result, the integrated circuit device 10 according to an exemplary embodiment of the inventive concept may have improved electrical characteristics and reliability.

Figure 3:
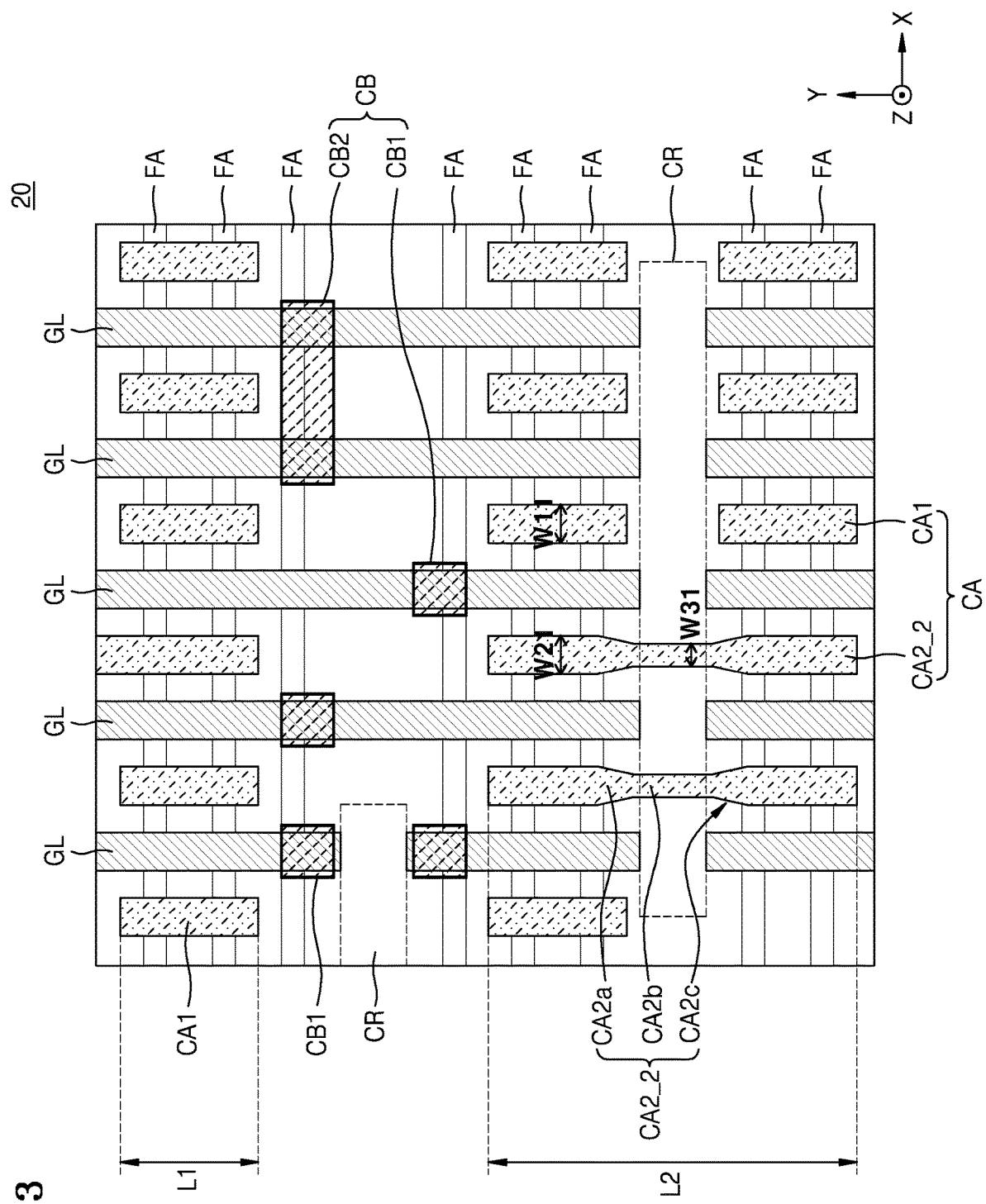
FIGS. 3, 4 and 5 are layouts illustrating integrated circuit devices according to embodiments of the inventive concept, respectively.
Figure 4:
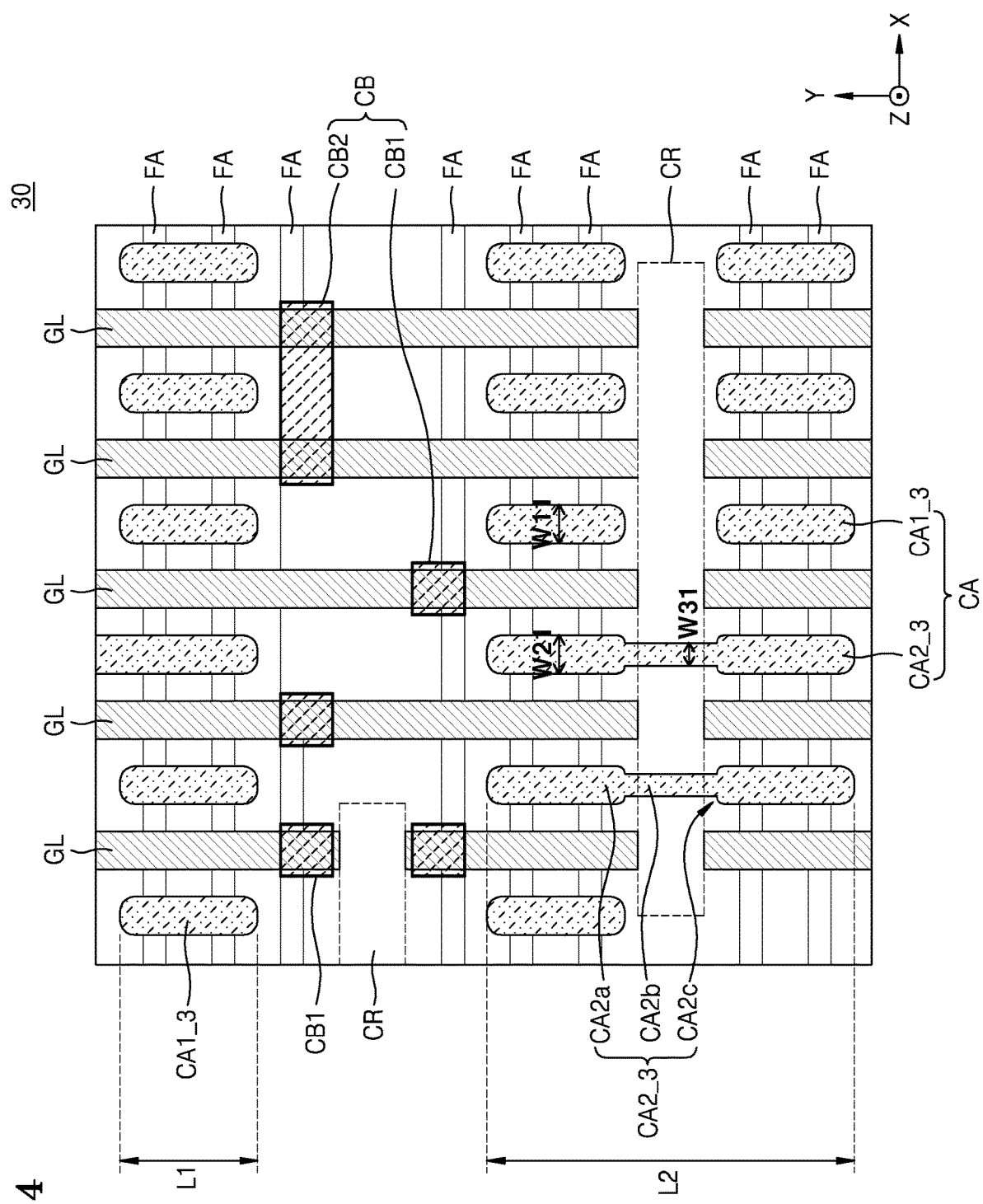
Figure 5:
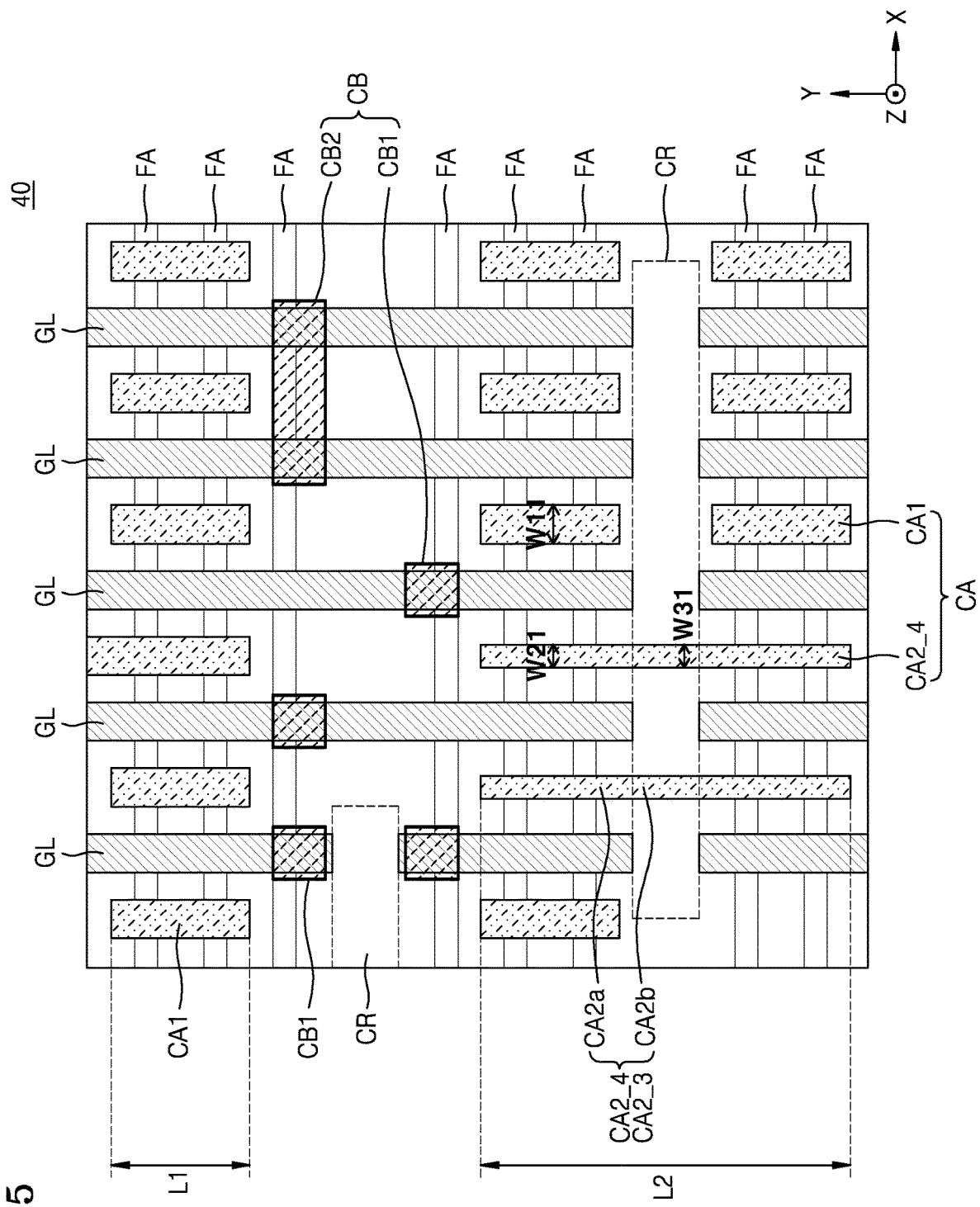

FIGS. 3 to 5 are layouts illustrating integrated circuit devices according to exemplary embodiments of the inventive concept, respectively.

Most of the components constituting integrated circuit devices 20, 30, and 40 described below and materials constituting the components may be substantially the same as or similar to those described above with reference to FIGS. 1 to 2F. Therefore, for convenience of description, the following description will focus on differences from the integrated circuit device 10 in FIG. 1.

Referring FIG. 3, the integrated circuit device 20 may include the substrate 110 having the fin type active region FA, the gate structure 120 extending and intersecting with the fin type active region FA, the source/drain region 114 arranged on both sides of the gate structure 120, the gate isolation insulating layer 134 in contact with the end of the gate structure 120, and the active contact CA electrically connected to the source/drain region 114.

The active contact CA may include the first contact CA1 and a second contact CA2_2. The first contact CA1 may be arranged on the source/drain region 114 between two neighboring gate structures 120, and the second contact CA2_2 may extend in the second direction (the Y direction) from between two neighboring gate structures 120 to one side of the gate isolation insulating layer 134.

The second contact CA2_2 may be arranged on the source/drain region 114 between two neighboring gate structures 120 and may extend in the second direction (the Y direction) to contact the gate isolation insulating layer 134. In a plan view, the second contact CA2_2 may be arranged between a first pair of gate lines GL spaced apart from each other in the first direction (the X direction) and may be arranged to extend from between the first pair of gate lines GL to between a second pair of gate lines GL spaced apart from the first pair of gate lines GL in the second direction (the Y direction). In this case, the second contact CA2_2 may overlap the gate cut region CR.

The second contact CA2_2 may include the first portion CA2a facing or contacting the sidewall of the gate structure 120 and the second portion CA2b facing or contacting the gate isolation insulating layer 134. The first width W21 in the first direction (the X direction) of the first portion CA2a of the second contact CA2_2 may be greater than the second width W31 in the first direction (the X direction) of the second portion CA2b of the second contact CA2_2. Herein, the width of the first portion CA2a positioned in the same plane in the first direction (the X direction) as the end of the gate structure 120 may be substantially the same as the second width W31 of the second portion CA2b. In other words, with reference to FIG. 3, a part of the first portion CA2a adjacent to an end of one of the gate lines GL in the first direction (the X direction) may have the second width W31.

The third portion CA2c connecting the first part CA2a to the second part CA2b of the second contact CA2_2 may be further included. A width in the first direction (the X direction) of the third portion CA2c of the second contact CA2_2 may become narrower as it approaches the second portion CA2b from the first portion CA2a. In other words, the third portion CA2c of the second contact CA2_2 may have an inclined sidewall.

Herein, the first contact CA1 and the second contact CA2_2 are compared as follows. The first length L1 in the second direction (the Y direction) of the first contact CA1 may be less than the second length L2 in the second direction (the Y direction) of the second contact CA2_2. In addition, the first contact CA1 may not overlap the gate isolation insulating layer 134, and the second contact CA2_2 may cross the gate isolation insulating layer 134. In addition, the upper width W1 in the first direction (the X direction) of the first contact CA may be substantially the same as the upper width W21 of the first portion CA2a of the second contact CA2_2.

Referring FIG. 4, the integrated circuit device 30 may include the substrate 110 having the fin type active region FA, the gate structure 120 extending and intersecting with the fin type active region FA, the source/drain region 114 arranged on both sides of the gate structure 120, the gate isolation insulating layer 134 in contact with the end of the gate structure 120, and the active contact CA electrically connected to the source/drain region 114.

The active contact CA may include a first contact CA1_3 and a second contact CA2_3. The first contact CA1_3 may be arranged on the source/drain region 114 between two neighboring gate structures 120, and the second contact CA2_3 may extend in the second direction (the Y direction) from between two neighboring gate structures 120 to one side of the gate isolation insulating layer 134. An edge of the first contact CA1_3 may have a rounded shape.

The second contact CA2_3 may be arranged on the source/drain region 114 between two neighboring gate structures 120 and may extend in the second direction (the Y direction) to contact the gate isolation insulating layer 134. In a plan view, the second contact CA2_3 may be between a first pair of gate lines GL spaced apart from each other in the first direction (the X direction) and may be arranged to extend from between the first pair of gate lines GL to between a second pair of gate lines GL spaced apart from the first pair of gate lines GL in the second direction (the Y direction). In this case, the second contact CA2_3 may overlap the gate cut region CR.

The second contact CA2_3 may include the first portion CA2a facing or contacting the sidewall of the gate structure 120 and the second portion CA2b facing or contacting the gate isolation insulating layer 134. The first width W21 in the first direction (the X direction) of the first portion CA2a of the second contact CA2_3 may be greater than the second width W31 in the first direction (the X direction) of the second portion CA2b of the second contact CA2_3. Herein, the width of the first portion CA2a positioned in the same plane in the first direction (the X direction) as the end of the gate structure 120 may be substantially the same as the second width W31 of the second portion CA2b. In other words, near the end of a gate line GL, the width of the first portion CA2a may decrease.

The third portion CA2c connecting the first part CA2a to the second part CA2b of the second contact CA2_3 may be further included. The third portion CA2c of the second contact CA2_3 may be a portion protruding with a round shape. For example, the second contact CA2_3 may have a peanut shape.

Herein, the first contact CA1_3 and the second contact CA2_3 are compared as follows. The first length L1 in the second direction (the Y direction) of the first contact CA1_3 may be less than the second length L2 in the second direction (the Y direction) of the second contact CA2_3. In addition, the first contact CA1_3 may not overlap the gate isolation insulating layer 134, and the second contact CA2_3 may cross the gate isolation insulating layer 134. In addition, the upper width W1 in the first direction (the X direction) of the first contact CA1_3 may be substantially the same as the upper width W21 of the first portion CA2a of the second contact CA2_3.

Referring FIG. 5, the integrated circuit device 30 may include the substrate 110 having the fin type active region FA, the gate structure 120 extending and intersecting with the fin type active region FA, the source/drain region 114 arranged on both sides of the gate structure 120, the gate isolation insulating layer 134 in contact with the end of the gate structure 120, and the active contact CA electrically connected to the source/drain region 114.

The active contact CA may include the first contact CA1 and a second contact CA2_4. The first contact CA1 may be arranged on the source/drain region 114 between two neighboring gate structures 120, and the second contact CA2_4 may extend in the second direction (the Y direction) from between two neighboring gate structures 120 to one side of the gate isolation insulating layer 134.

The second contact CA2_4 may be arranged on the source/drain region 114 between two neighboring gate structures 120 and may extend in the second direction (the Y direction) to contact the gate isolation insulating layer 134. In a plan view, the second contact CA2_4 may be between a first pair of gate lines GL spaced apart from each other in the first direction (the X direction) and may be arranged to extend from between the first pair of gate lines GL to between a second pair of gate lines GL spaced apart from the first pair of gate lines GL in the second direction (the Y direction). In this case, the second contact CA2_4 may overlap the gate cut region CR.

The second contact CA2_4 may include the first portion CA2a facing or contacting the sidewall of the gate structure 120 and the second portion CA2b facing or contacting the gate isolation insulating layer 134. The first width W21 in the first direction (the X direction) of the first portion CA2a of the second contact CA2_4 may be equal to the second width W31 in the first direction (the X direction) of the second portion CA2b of the second contact CA2_4. Accordingly, the second contact CA2_4 may have a tapered bar shape on the whole, in the third direction (the Z direction) perpendicular to the top surface of the substrate 110.

Herein, the first contact CA1 and the second contact CA2_4 are compared as follows. The first length L1 in the second direction (the Y direction) of the first contact CA1 may be less than the second length L2 in the second direction (the Y direction) of the second contact CA2_4. In addition, the first contact CA1 may not overlap the gate isolation insulating layer 134, and the second contact CA2_4 may cross the gate isolation insulating layer 134. In addition, the upper width W11 in the first direction (the X direction) of the first contact CA1 may be greater than the upper width W21 of the first portion CA2a of the second contact CA2_4.

FIGS. 6A to 11C are cross-sectional views illustrating a method of manufacturing an integrated circuit device according to an exemplary embodiment of the inventive concept, in a process sequence.

Specifically, FIGS. 6A, 7A, 8A, 9A, 10A, and 11A respectively correspond to sectional views taken along the line A-A' of FIG. 1, FIGS. 6B, 7B, 8B, 9B, 10B, and 11B respectively correspond to cross-sectional views taken along the line B-B' of FIG. 1, and FIGS. 6C, 7C, 8C, 9C, 10C, and 11C respectively correspond to sectional views taken along the line C-C' of FIG. 1.

Figure 6A:
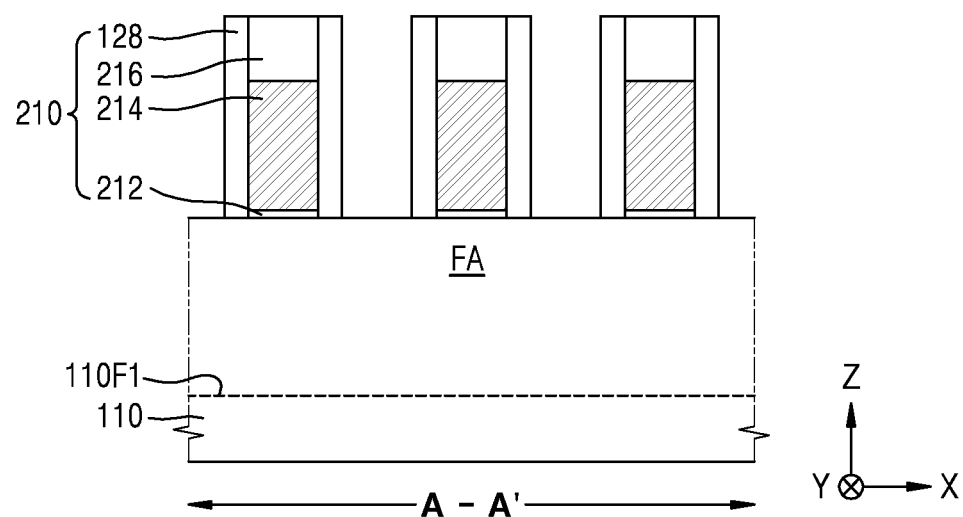
FIGS. 6A, 6B, 6C, 7A, 7B, 7C, 8A, 8B, 8C, 9A, 9B, 9C, 10A, 10B, 10C, 11A, 11B and 11C are cross-sectional views illustrating a method of manufacturing an integrated circuit device according to an exemplary embodiment of the inventive concept, according to a process sequence.
Figure 6B:
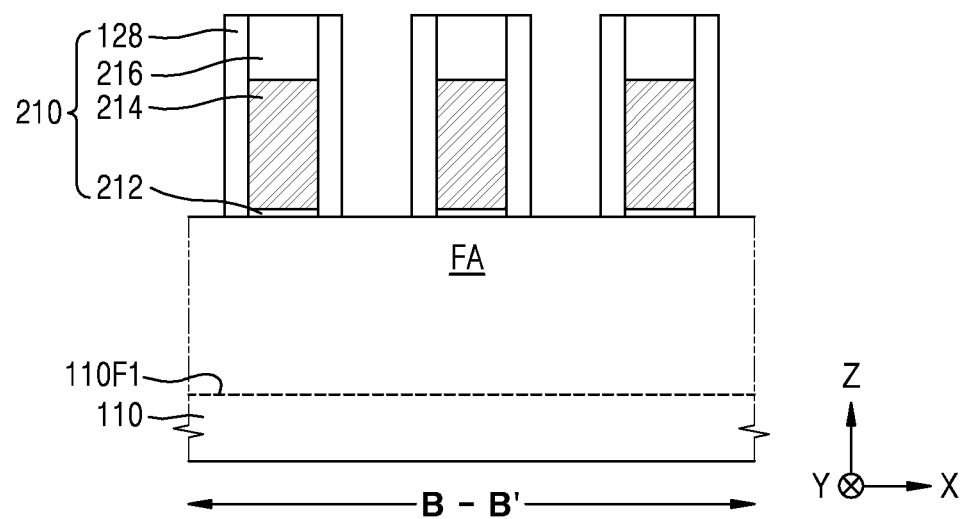
Figure 6C:
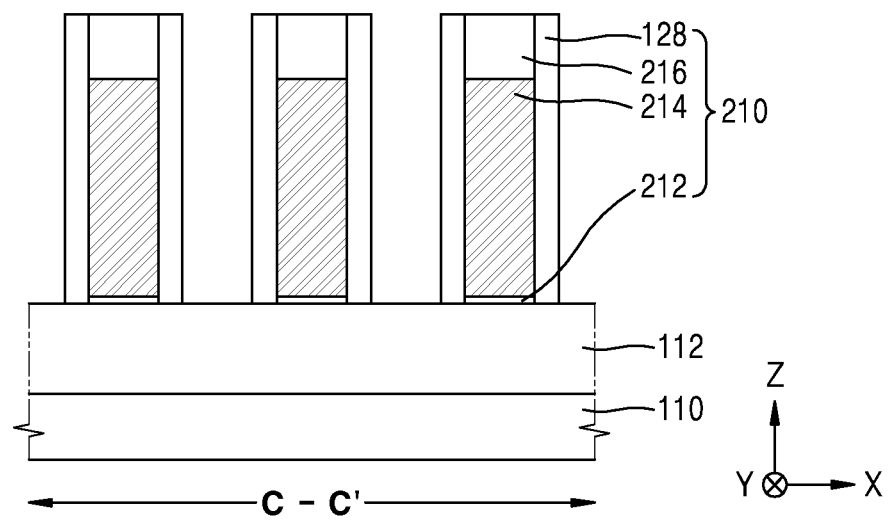

Referring to FIGS. 6A to 6C, the fin type active region FA may be formed by etching a portion of the active region of the substrate 110, so that the fin type active region FA may protrude in a vertical direction from the top surface 110F1 of the substrate 110 and may extend in the first direction (the X direction).

The device isolation layer 112 may be formed on the substrate 110 to cover both sidewalls of the fin type active region FA. In addition, an interfacial film that conformally covers the sidewalls of the fin type active region FA may be formed between the device isolation layer 112 and the fin type active region FA.

After a sacrificial gate insulating layer, a sacrificial gate conductive layer, and a hard mask pattern 216 are sequentially formed on the substrate 110, a sacrificial gate 214 and a sacrificial gate insulating layer pattern 212 may be formed by patterning the sacrificial gate conductive layer and the sacrificial gate insulating layer by using the hard mask pattern 216 as an etch mask.

A spacer insulating layer covering the hard mask pattern 216, the sacrificial gate 214, and the sacrificial gate insulating layer pattern 212 may be formed by using an atomic layer deposition (ALD) process or a chemical vapor deposition (CVD) process, and then an anisotropic etching process may be performed on the spacer insulating layer to form the gate spacers 128 on both sidewalls of the hard mask pattern 216, the sacrificial gate 214, and the sacrificial gate insulating layer pattern 212. For example, the gate spacer 128 may include silicon nitride, but is not limited thereto.

Herein, the sacrificial gate insulating layer pattern 212, the sacrificial gate 214, the hard mask pattern 216, and the gate spacer 128 may be referred to as components of a sacrificial gate structure 210.

Figure 7A:
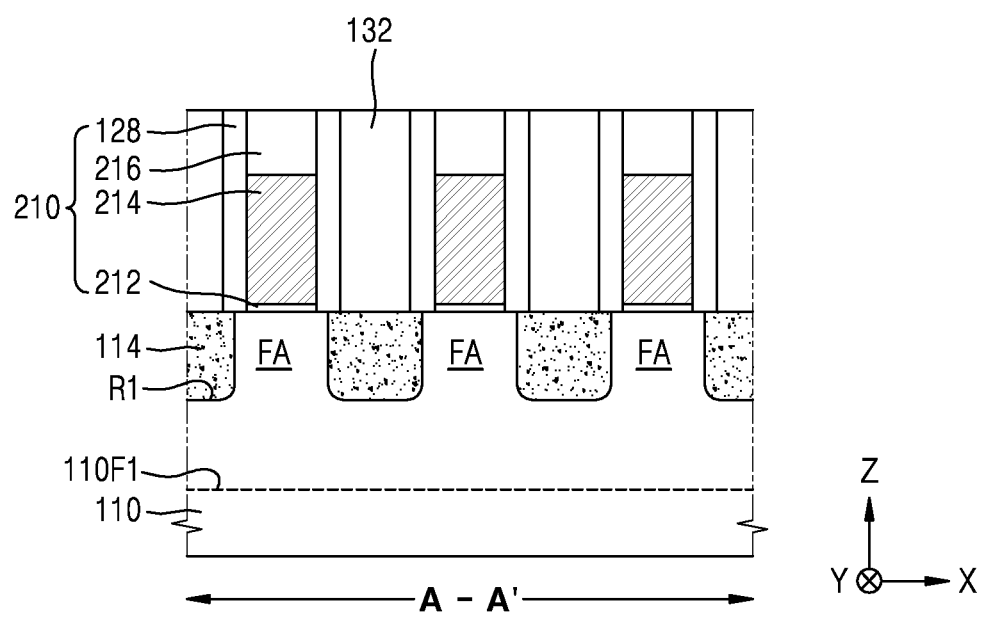
Figure 7B:
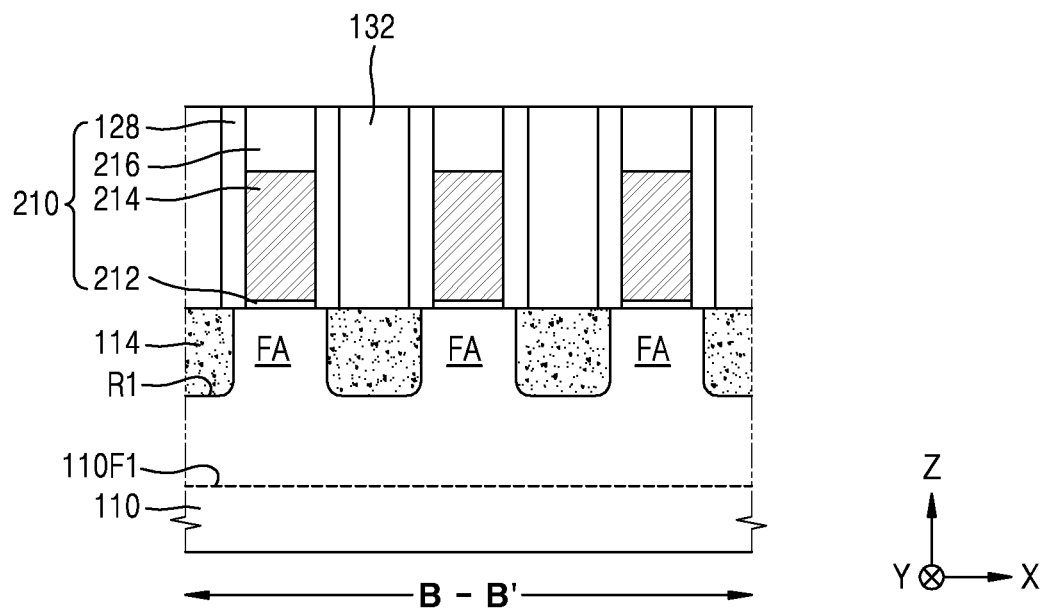
Figure 7B:
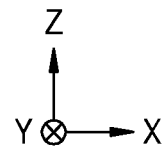
Figure 7C:
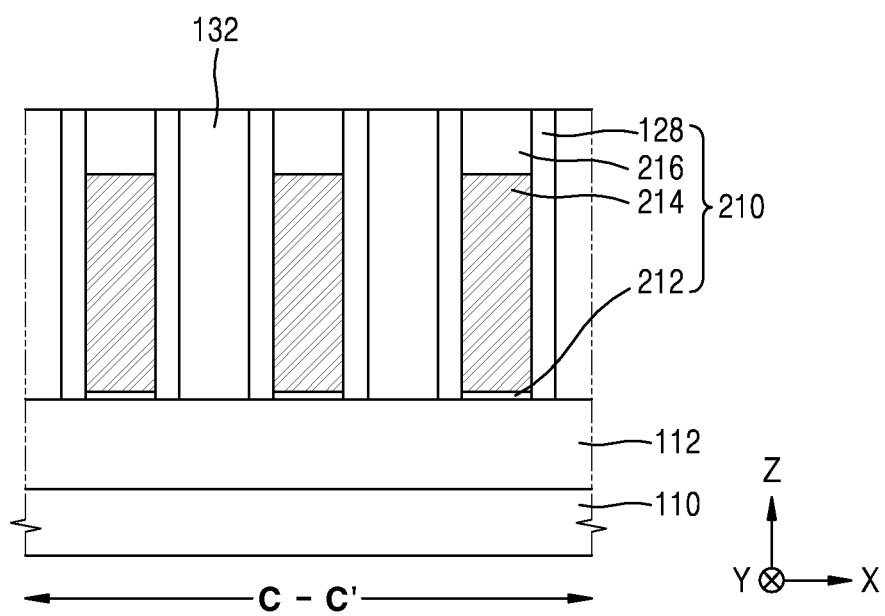
Figure 7C:
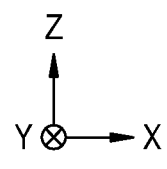

Referring to FIGS. 7A to 7C, a portion of the fin type active region FA under both sides of the sacrificial gate structure 210 may be etched to form a recess region R1, and then the source/drain region 114 may be formed in the recess region R1.

In exemplary embodiments of the inventive concept, the source/drain region 114 may be formed by an epitaxy process by using the sidewall of the fin type active region FA exposed on an inner wall of the recess region R1 and the top surface of the substrate 110 as a seed layer. The epitaxy process may include vapor-phase epitaxy (VPE), a CVD process such as ultra-high vacuum chemical vapor deposition (UHV-CVD), molecular beam epitaxy, or combinations thereof. In the epitaxy process, a precursor in liquid or gaseous phase may be used as a precursor for forming the source/drain region 114.

The source/drain region 114 may have various shapes by controlling growth conditions in the epitaxy process. For example, the source/drain region 114 may have a polygonal shape formed by connecting inclined surfaces 114F (see FIG. 2D) inclined at a predetermined angle to each other. However, the shape of the source/drain region 114 is not limited thereto, and the shape of the source/drain region 114 may have various shapes depending on the material of the fin type active region FA, the material of the source/drain region 114, the type of the transistor formed on the substrate 110, and the conditions of the epitaxy process.

An insulating layer covering the gate spacer 128 and the hard mask pattern 216 may be formed on the substrate 110, and then the insulating layer may be planarized until top surfaces of the gate spacer 128 and the hard mask pattern 216 are exposed, to the inter-gate insulating layer 132.

Figure 8A:
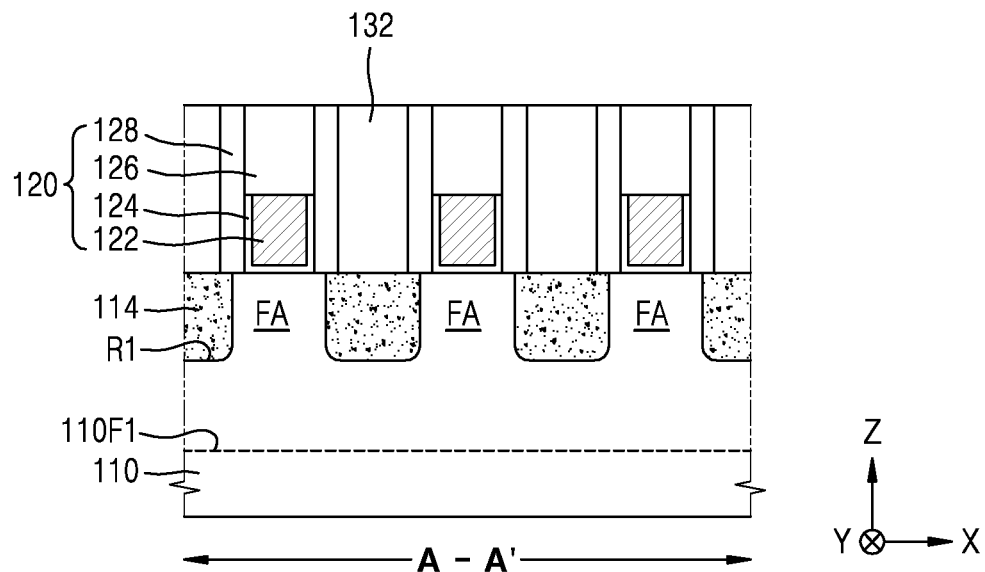
Figure 8B:
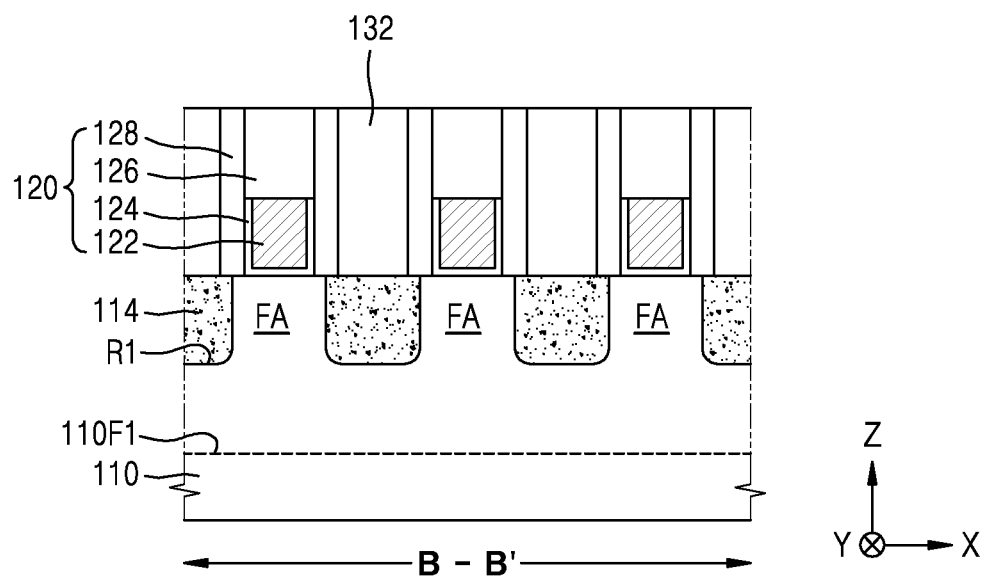
Figure 8C:
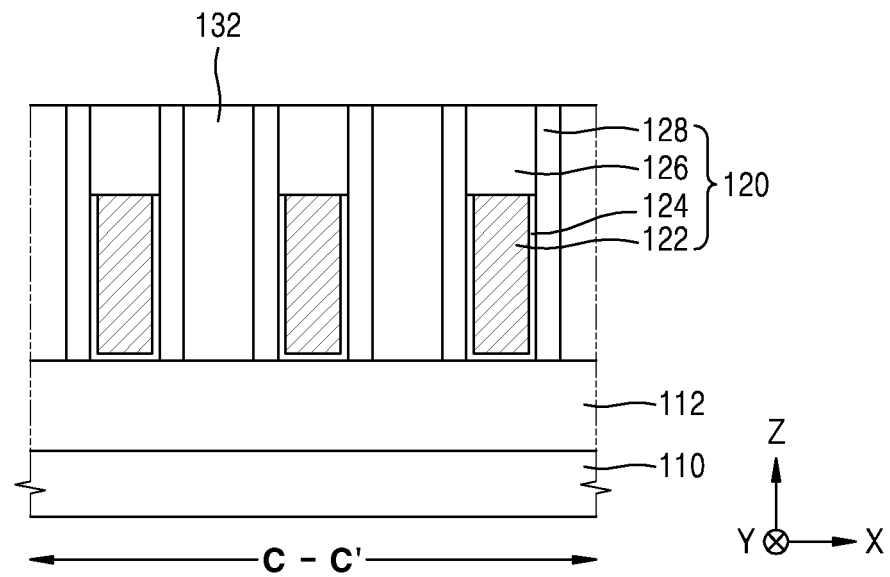

Referring to FIGS. 8A to 8C, the hard mask pattern 216 (see FIG. 7A), the sacrificial gate 214 (see FIG. 7A), and the sacrificial gate insulating layer pattern 212 (see FIG. 7A) may be removed to form a gate space between sidewalls of the gate spacer 128, and then the gate insulating layer 124 may be formed on an inner wall of the gate space.

After forming a conductive layer filling the gate space on the gate insulating layer 124, the gate electrode 122 may be formed by removing an upper portion of the conductive layer by an etch-back process. After forming an insulating layer filling a remaining portion of the gate space on the gate electrode 122 and the inter-gate insulating layer 132, the gate capping layer 126 filling the gate space may be formed by removing an upper portion of the insulating layer until top surfaces of the inter-gate insulating layer 132 or the gate spacer 128 are exposed.

In exemplary embodiments of the inventive concept, a removal process of the sacrificial gate structure 210 (see FIG. 7A) may use a wet etching process. In order to perform the wet etching process, for example, an etching solution including $HNO_3$, diluted fluoric acid (DHF), $NH_4OH$, tetramethyl ammonium hydroxide (TMAH), KOH, or combinations thereof may be used.

Herein, the gate electrode 122, the gate insulating layer 124, the gate capping layer 126, and the gate spacer 128 may be referred to as components of the gate structure 120. A predetermined portion of upper portions of the inter-gate insulating layer 132 and the gate spacer 128 may be removed in an etch-back process for forming the gate structure 120, so that heights of the inter-gate insulating layer 132 and the gate spacer 128 may be lowered. In other words, the height of the gate structure 120 may be lower than a height of the sacrificial gate structure 210 (see FIG. 7A).

Figure 9A:
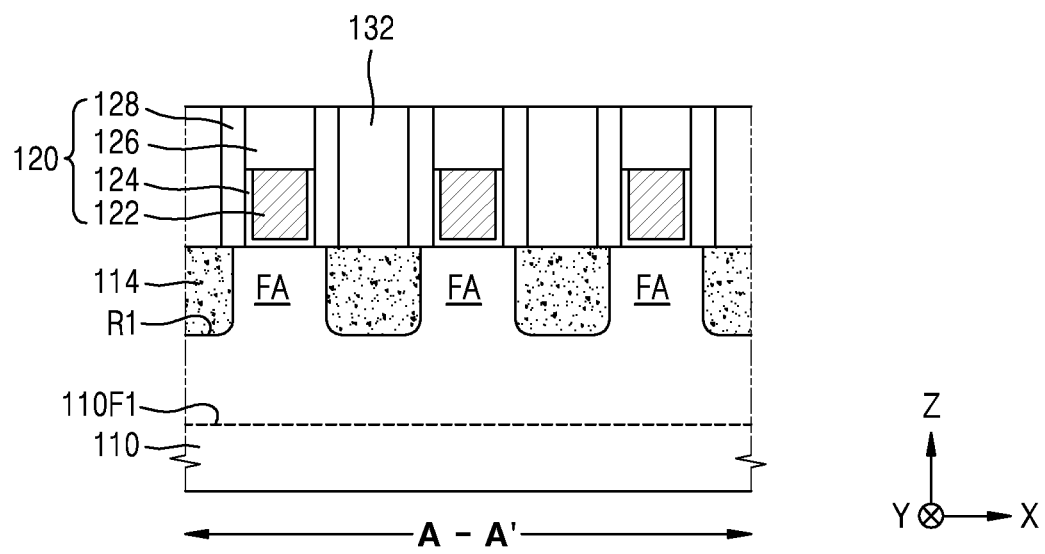
Figure 9B:
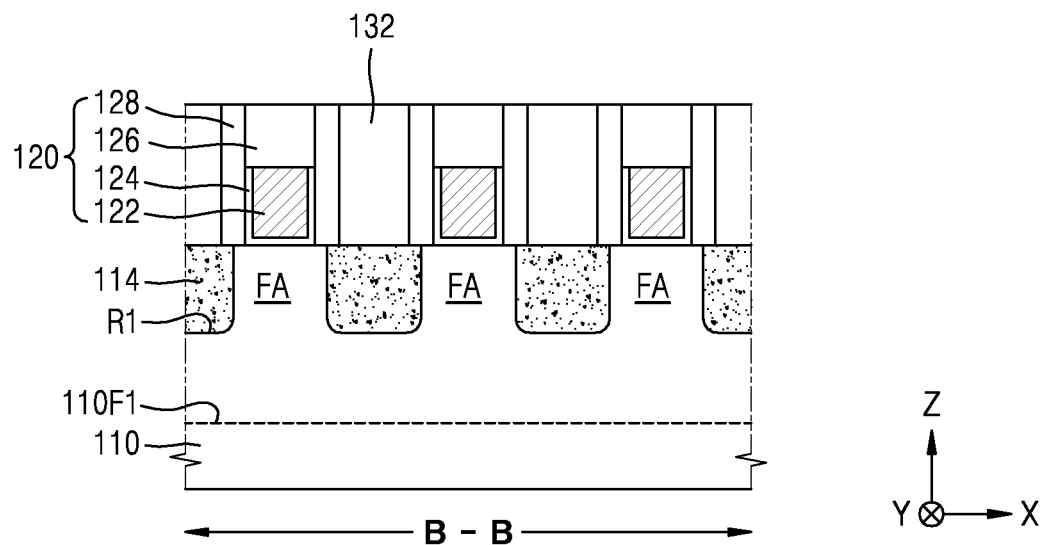
Figure 9C:
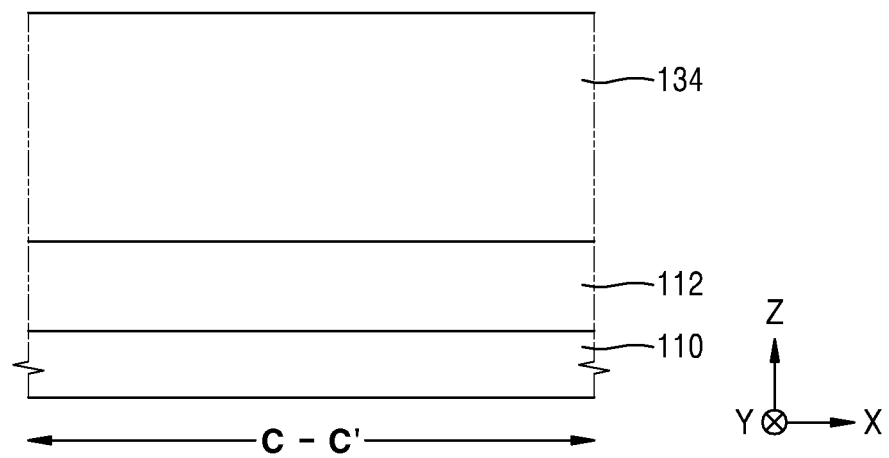

Referring to FIGS. 9A to 9C, a mask pattern exposing the gate cut region CR (see FIG. 1) may be formed on the gate structure 120 and the inter-gate insulating layer 132, and a portion of the gate structure 120 overlapping the gate cut region CR may be removed by using the mask pattern as an etching mask.

An insulating layer may be formed to fill a space from which the portion of the gate structure 120 is removed, and the etch-back process may be performed on the insulating layer to form the gate isolation insulating layer 134 filling the gate cut region CR (see FIG. 1). Therefore, the cut end of the gate structure 120 may be in contact with the gate isolation insulating layer 134.

In other exemplary embodiments of the inventive concept, before the process of forming the gate structure 120, a portion of the sacrificial gate structure 210 that overlaps the gate cut region CR may be removed, and then the gate isolation insulating layer 134 filling the empty space may be formed. Then, the hard mask pattern 216 (see FIG. 7A), the sacrificial gate 214 (see FIG. 7A), and the sacrificial gate insulating layer pattern 212 (see FIG. 7A) may be removed to form the gate space between sidewalls of the gate spacer 128, and then the gate insulating layer 124, the gate electrode 122, and the gate capping layer 126 may be sequentially formed on the inner wall of the gate space.

Figure 10A:
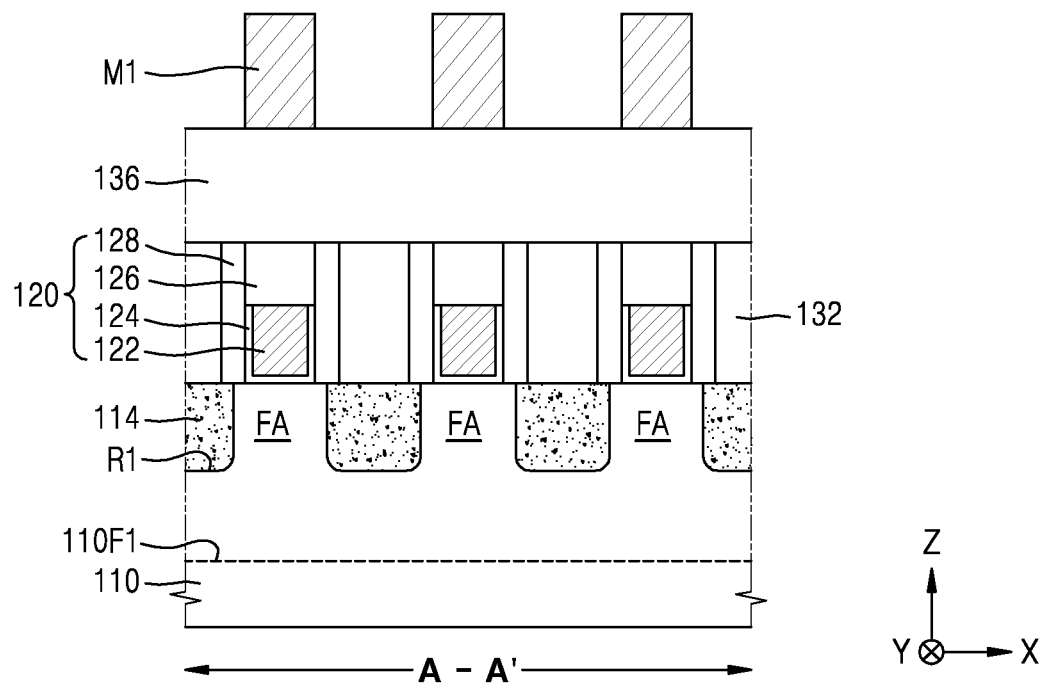
Figure 10B:
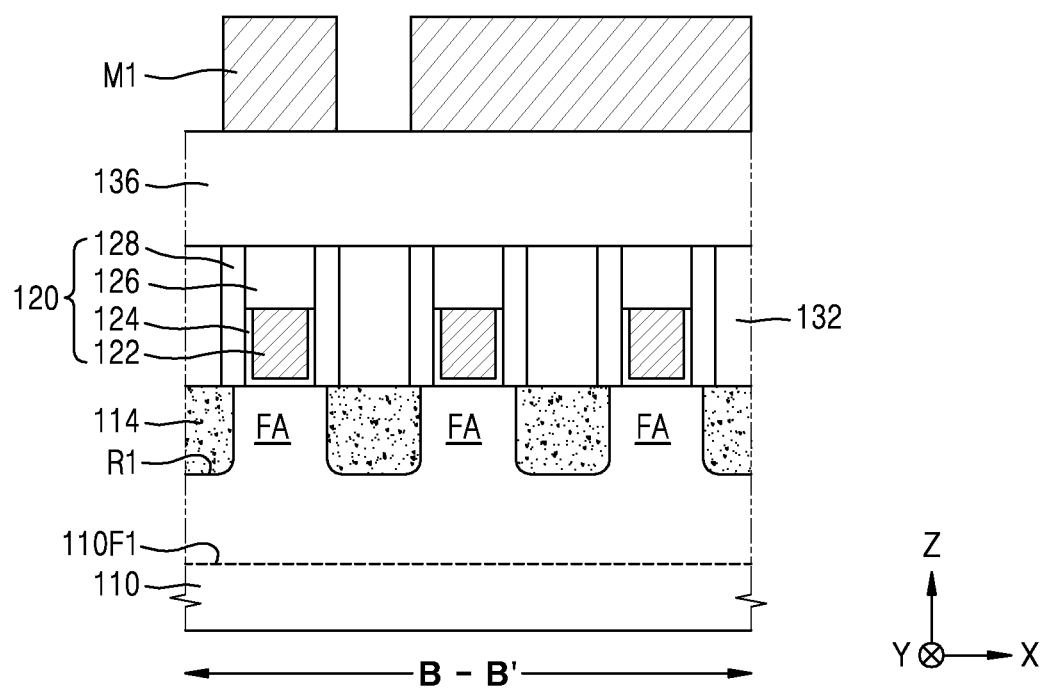
Figure 10C:
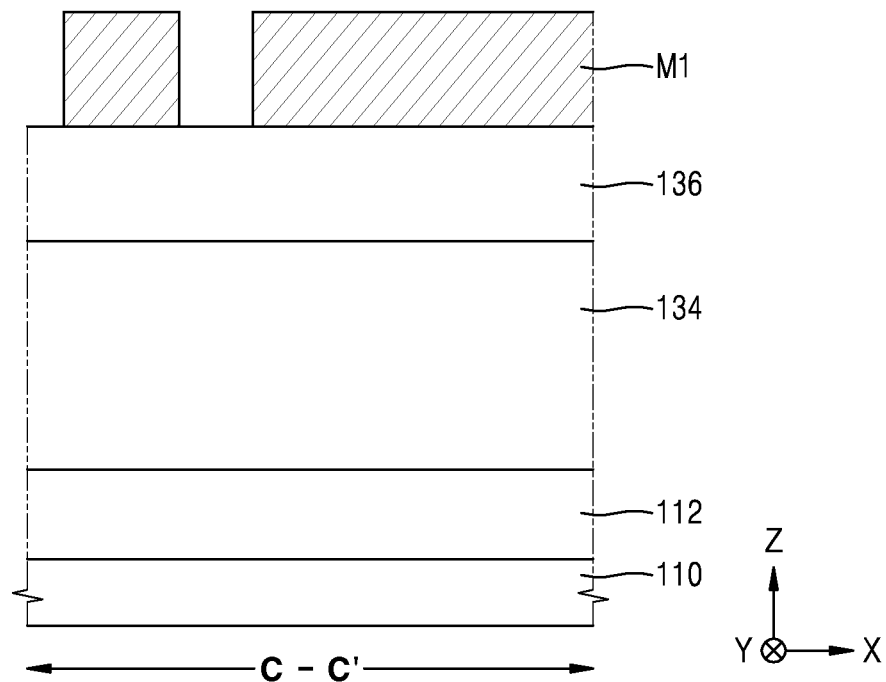

Referring to FIGS. 10A to 10C, the interlayer insulating layer 136 may be formed to cover the gate structure 120 and the inter-gate insulating layer 132.

A first mask pattern M1 may be formed on the interlayer insulating layer 136. The first mask pattern M1 may be arranged at a position overlapping the gate structure 120 and may extend in the second direction (the Y direction).

For example, the first mask pattern M1 may be formed on the interlayer insulating layer 136 by a lithography process. The first mask pattern M1 may be formed by coating a photoresist and then patterning the photoresist by exposure and development. Herein, an open area in which the active contact CA (see FIG. 1) is to be formed may be defined by the first mask pattern M1.

The first mask pattern M1 according to the present embodiment may be formed through the above-mentioned process using the extreme ultraviolet.

Figure 11A:
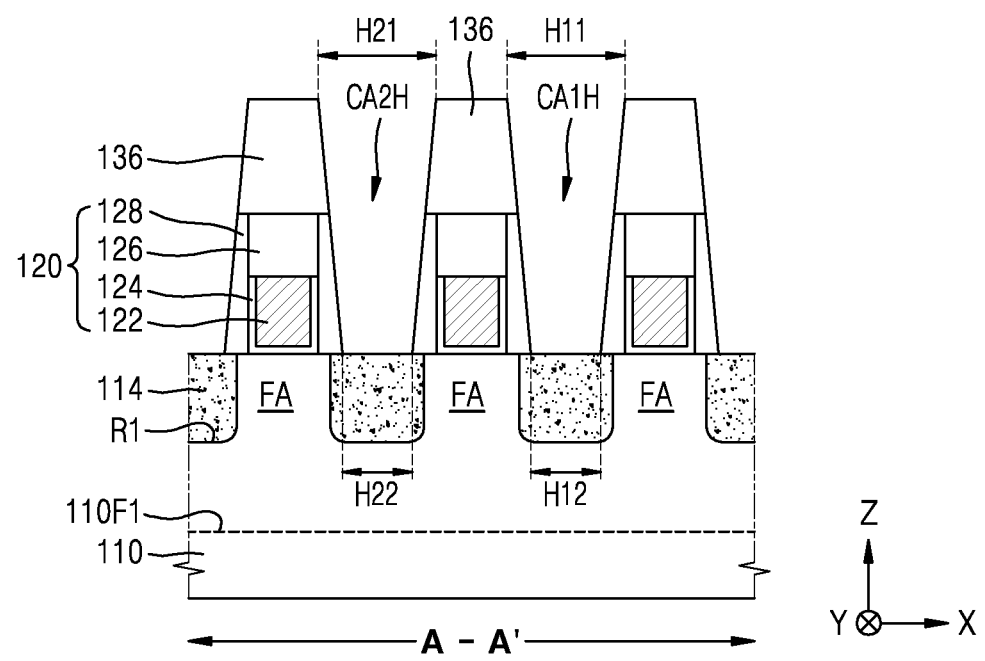
Figure 11B:
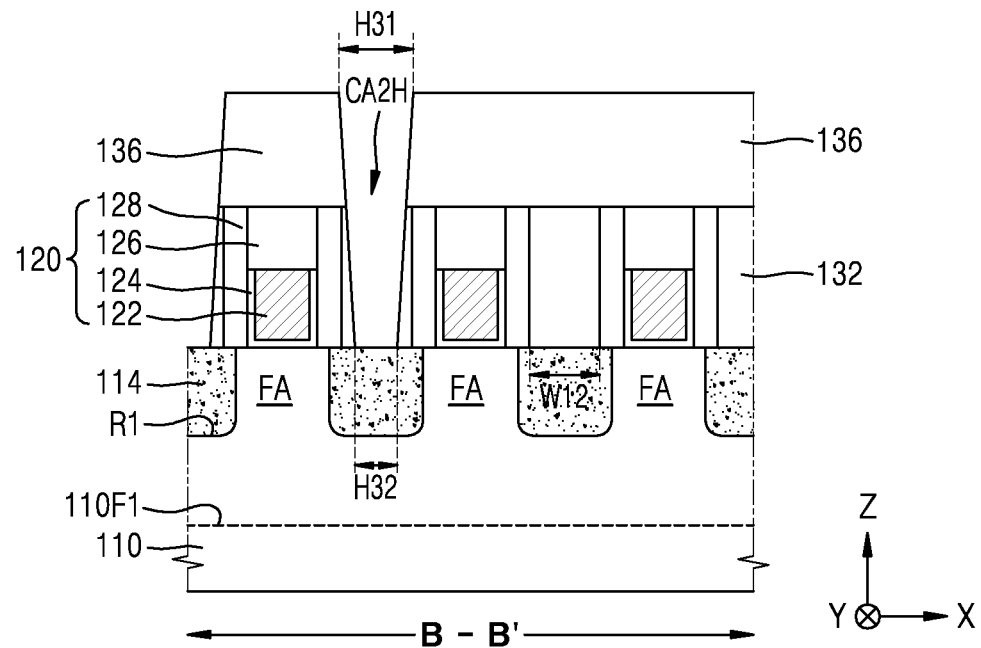
Figure 11C:
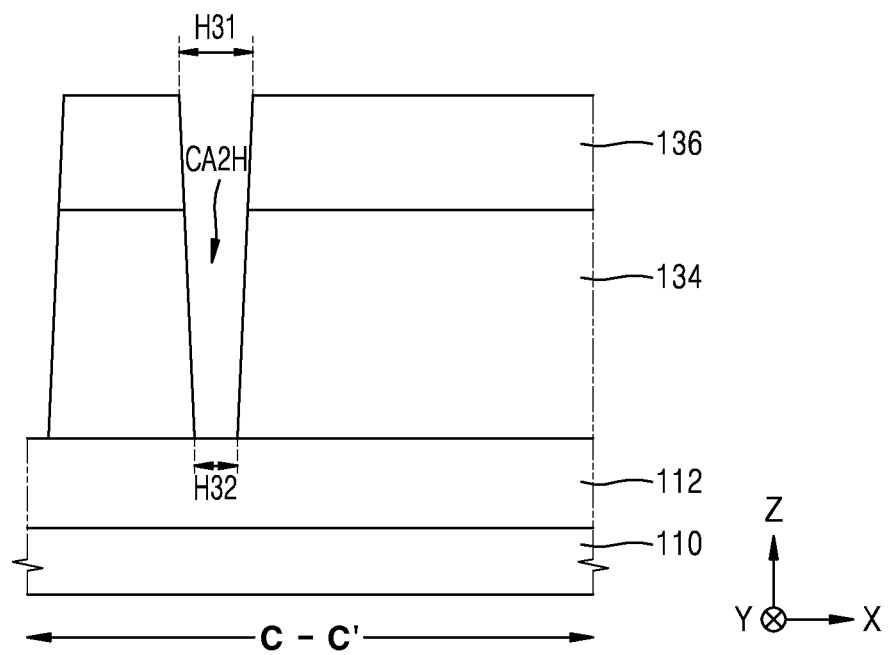

Referring to FIGS. 11A to 11C, the interlayer insulating layer 136 and the inter-gate insulating layer 132 may be etched by using the first mask pattern M1 (see FIG. 10A) as an etch mask, whereby the first contact hole CA1H and the second contact hole CA2H may be formed to expose a portion of a top surface of the source/drain region 114.

The first contact hole CA1H may be formed to expose sidewalls of the gate spacer 128. A portion of the second contact hole CA2H may be formed to expose the sidewalls of the gate spacer 128, and another portion of the second contact hole CA2H may be formed with a relatively small width so as not to expose the sidewalls of the gate spacer 128.

The first contact hole CA1H may expose the top surface of the source/drain region 114 between the neighboring gate structures 120. The second contact hole CA2H may expose the top surface of the source/drain region 114 between the neighboring gate structures 120 and may expose the top surface of the device isolation layer 112 through the gate isolation insulating layer 134.

For example, the first contact hole CA1H may have a tapered profile in which an upper width H11 is greater than a lower width H12. In addition, a portion of the second contact hole CA2H may have a tapered profile in which an upper width H21 is greater than a lower width H22, and likewise, another portion of the second contact hole CA2H may have the tapered profile in which an upper width H31 is greater than a lower width H32.

Herein, the first contact hole CA1H and the second contact hole CA2H are compared as follows. The first contact hole CA1H may not overlap the gate isolation insulating layer 134, and the second contact hole CA2H may cross the gate isolation insulating layer 134. In addition, the upper width H11 in the first direction (the X direction) of the first contact hole CA1H may be substantially the same as the upper width H21 of a portion of the second contact hole CA2H.

Referring again to FIGS. 1 to 2F, the conductive barrier layer 154 may be formed on inner walls of the first contact hole CA1H and the second contact hole CA2H by using Ti, Ta, TiN, TaN, or combinations thereof. The active contact plug 152 may be formed on the conductive barrier layer 154 to fill the first contact hole CA1H and the second contact hole CA2H, and then upper portions of the active contact plug 152 and the conductive barrier layer 154 may be removed until the top surface of the interlayer insulating layer 136 is exposed, thereby forming the first contact CA1H and the second contact CA2 in the first contact hole CA1H and the second contact hole CA2H, respectively.

Subsequently, a second mask pattern may be formed on the interlayer insulating layer 136, and a portion of the interlayer insulating layer 136 may be removed by using the second mask pattern as an etching mask, thereby forming the third contact hole CB1H and the fourth contact hole CB2H exposing a top surface of the gate electrode 122. The conductive barrier layer 158 may be formed on inner walls of the third contact hole CB1H and the fourth contact hole CB2H by using Ti, Ta, TiN, TaN, or combinations thereof. The gate contact plug 156 may be formed on the conductive barrier layer 158 to form the third contact CB1 and the fourth contact CB2 filling the third contact hole CB1H and the fourth contact hole CB2H, respectively.

In other exemplary embodiments of the inventive concept, after forming the first contact hole CA1H and the second contact hole CA2H and before forming the first contact CA and the second contact CA2, the third contact hole CB1H and the fourth contact hole CB2H may be formed and then the first contact CA1, the second contact CA2, the third contact CB1, and the fourth contact CB2 respectively filling the first contact hole CA1H, the second contact hole CA2H, the third contact hole CB1H, and the fourth contact hole CB2H may be formed at once.

Through these manufacturing processes, the integrated circuit device 10 according to an exemplary embodiment of the inventive concept may be manufactured, and the electrical characteristics and reliability of the integrated circuit device 10 may be improved.

Figure 12:
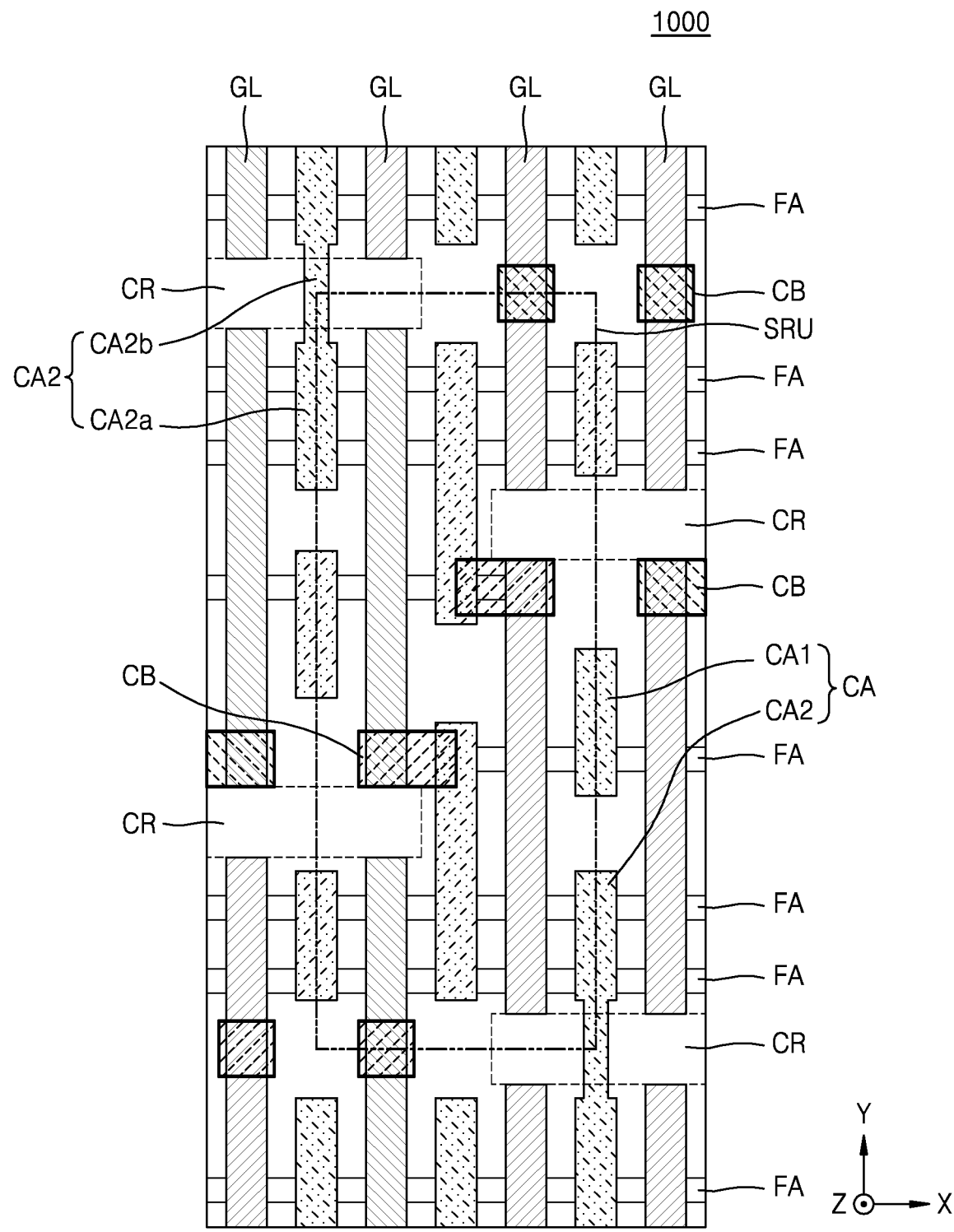
FIG. 12 is a layout illustrating a static random access memory (SRAM) device among integrated circuit devices according to an exemplary embodiment of the inventive concept.

FIG. 12 is a layout illustrating a static random access memory (SRAM) device among integrated circuit devices according to an exemplary embodiment of the inventive concept.

Referring to FIG. 12, the SRAM device 1000 may include the gate line GL, the gate cut region CR, the fin type active region FA, the active contact CA, and the gate contact CB.

An unit cell SRU of the SRAM device 1000 may include a plurality of pull-down transistors and a plurality of pull-up transistors.

The active contact CA may include the first contact CA1 and the second contact CA2. The second contact CA2 may include the first portion CA2a that faces or contacts the sidewall of the gate line GL and the second portion CA2b that crosses the gate cut region CR. The width in the first direction (the X direction) of the first portion CA2a of the second contact CA2 may be greater than the width in the first direction (the X direction) of the second portion CA2b.

The active contact CA may be used as a source contact, a drain contact, a bit line contact, a complementary bit line contact, a power node contact, or a ground node contact of the SRAM device 1000.

In addition, the active contact CA may be used as a storage node contact of the SRAM device 1000. For example, the active contact CA may connect drains of the pull-down transistor and the pull-up transistor implemented by the gate line GL to a pass gate. However, the inventive concept is not limited thereto.

Figure 13:
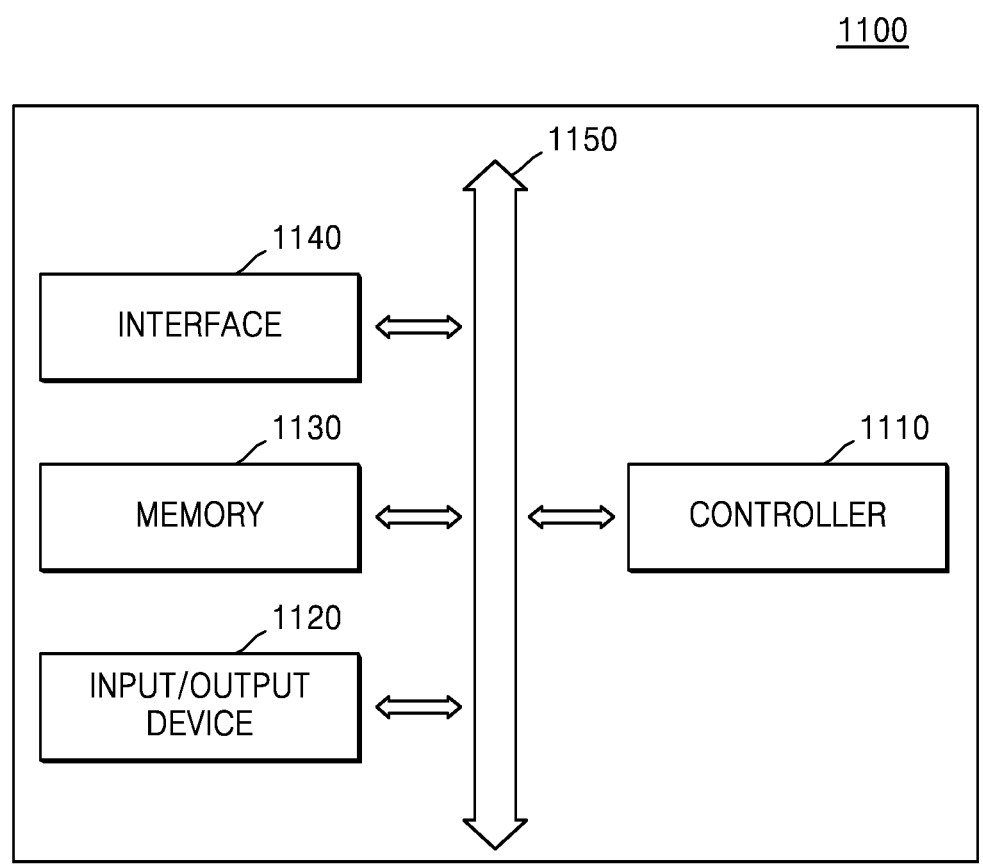
FIG. 13 is a block diagram illustrating a system of an integrated circuit device according to an exemplary embodiment of the inventive concept.

FIG. 13 is a block diagram illustrating a system of an integrated circuit device according to an exemplary embodiment of the inventive concept.

Referring to FIG. 13, the system 1100 may include a controller 1110, an input/output device 1120, a memory 1130, an interface 1140, and a bus 1150.

The system 1100 may include a mobile system or a system that transmits or receives information. In exemplary embodiments of the inventive concept, the mobile system may include a portable computer, a tablet, a mobile phone, a digital music player, a memory card, or the like.

The controller 1110 may be used to control an execution program in the system 1100 and may include a microprocessor, a digital signal processor, a microcontroller, or a similar device.

The input/output device 1120 may be used to input or output data of the system 1100. The system 1100 may be connected to an external device, for example, a computer or a network, by using the input/output device 1120, and may exchange data with the external device. The input/output device 1120 may include, for example, a touch pad, a keyboard, a mouse, or a display.

The memory 1130 may store data for the operation of the controller 1110 or store data processed by the controller 1110. The memory 1130 may include any one of the integrated circuit devices 10 to 40 according to the exemplary embodiments of the inventive concept described with reference to FIGS. 1 to 5.

The interface 1140 may include a data transmission path between the system 1100 and the external device. The controller 1110, the input/output device 1120, the memory 1130, and the interface 1140 may communicate with each other via the bus 1150.

Exemplary embodiments of the inventive concept provide an integrated circuit device and a method of manufacturing the same, the integrated circuit device including a contact structure that provides a reliable electrical connection while having a reduced size according to the reduction of the design rule.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. An integrated circuit device, comprising:
   a substrate comprising a fin type active region extending in a first direction;
   a gate structure intersecting the fin type active region on the substrate and extending in a second direction perpendicular to the first direction;
   a source/drain region arranged on both sides of the gate structure;
   a gate isolation insulating layer in contact with an end of the gate structure;
   a first contact connected to the source/drain region; and
   a second contact connected to the source/drain region, the second contact having a longer length in the second direction than the first contact,
   wherein the second contact comprises a first portion extending in the second direction from an area adjacent to one side of the gate structure beyond the end of the gate structure and facing a sidewall of the gate structure, and
   a second portion facing a sidewall of the gate isolation insulating layer, and
   wherein a first width in the first direction of the first portion is greater than a second width in the first direction of the second portion.

2. The integrated circuit device of claim 1, wherein, in the first direction, a third width of the first portion, which is adjacent to the end of the gate structure, is substantially equal to the second width.

3. The integrated circuit device of claim 1, wherein the second portion of the second contact crosses the gate isolation insulating layer.

4. The integrated circuit device of claim 1, wherein the first contact does not cross the gate isolation insulating layer, and
   a width in the first direction of the first contact is substantially equal to the first width of the first portion.

5. The integrated circuit device of claim 1, wherein the gate structure comprises:
   a gate electrode intersecting the fin active region on the substrate and extending in the second direction;
   a gate capping layer extending in the second direction on the gate electrode; and
   a gate spacer arranged on both sidewalls of the gate electrode and the gate capping layer.

6. The integrated circuit device of claim 5, wherein a shortest distance between the gate electrode at the end of the gate structure and the first portion of the second contact is greater than a shortest distance between the gate electrode at a center region of the gate structure and the first portion of the second contact.

7. The integrated circuit device of claim 1, wherein the first contact and the second contact are tapered in a third direction perpendicular to a top surface of the substrate.

8. The integrated circuit device of claim 1, wherein the first contact and the second contact are active contacts, and the integrated circuit device further comprises a gate contact arranged on the gate structure.

9. The integrated circuit device of claim 1, wherein a width in the first direction of a third portion connecting the first portion to the second portion of the second contact narrows as the third portion approaches the second portion.

10. The integrated circuit device of claim 1, wherein, in a plan view, an edge of the first portion of the second contact is rounded.

11. An integrated circuit device, comprising:
    a substrate comprising a fin type active region extending in a first direction;
    a gate structure intersecting the fin type active region on the substrate and extending in a second direction perpendicular to the first direction;
    a source/drain region arranged on both sides of the gate structure;
    a gate isolation insulating layer in contact with an end of the gate structure;
    a first contact connected to the source/drain region and not crossing the gate isolation insulating layer; and
    a second contact connected to the source/drain region and extending in the second direction while crossing the gate isolation insulating layer,
    wherein a width in the first direction of the first contact is greater than a width in the first direction of the second contact.

12. The integrated circuit device of claim 11, wherein the second contact comprises:
    a first portion facing a sidewall of the gate structure; and a second portion facing a sidewall of the gate isolation insulating layer, and wherein a first width in the first direction of the first portion is substantially equal to a second width in the first direction of the second portion.

13. The integrated circuit device of claim 11, wherein a length in the second direction of the first contact is less than a length in the second direction of the second contact.

14. The integrated circuit device of claim 11, wherein the first contact and the second contact are active contacts, and the integrated circuit device further comprises a gate contact arranged on the gate structure.

15. The integrated circuit device of claim 11, wherein the second contact has a bar shape tapered in a third direction perpendicular to a top surface of the substrate.

16. An integrated circuit device, comprising:
a substrate comprising a fin type active region extending in a first direction;
a plurality of gate structures intersecting the fin type active region on the substrate and extending in a second direction perpendicular to the first direction and parallel to a top surface of the substrate;
source/drain regions arranged between the plurality of the gate structures;
a gate isolation insulating layer extending in the first direction on the substrate and in contact with at least one end of the plurality of gate structures;
a first active contact connected to a first one of the source/drain regions; and
a second active contact connected to a second one of the source/drain regions and extending in the second direction from between a first pair of neighboring gate structures to between a second pair of neighboring gate structures while crossing the gate isolation insulating layer, wherein the second active contact comprises:
a first portion arranged between the first pair or second pair of neighboring gate structures; and
a second portion in contact with the gate isolation insulating layer, and
wherein a width in the first direction of the first portion is greater than a width in the first direction of the second portion.

17. The integrated circuit device of claim 16, wherein in a side view, the second active contact is tapered in a third direction perpendicular to a top surface of the substrate, and in a plan view, an edge of the first portion of the second active contact is rounded.

18. The integrated circuit device of claim 16, wherein a width in the first direction of the first active contact is substantially equal to the width in the first direction of the first portion, and
a length in the second direction of the first active contact is less than a length in the second direction of the second active contact.

19. The integrated circuit device of claim 16, wherein the plurality of gate structures form a plurality of gate lines,
the gate isolation insulating layer is formed in a gate cut region, and
the plurality of gate lines are collinear with the gate cut region interposed therebetween.

20. The integrated circuit device of claim 19, wherein the second active contact penetrates the gate cut region and is between the plurality of gate lines.

* * * * *